(12) United States Patent
Tanaka et al.

(10) Patent No.: US 7,933,120 B2
(45) Date of Patent: *Apr. 26, 2011

(54) COOLING STRUCTURE FOR RACKMOUNT-TYPE CONTROL DEVICE AND RACK-TYPE STORAGE CONTROL DEVICE

(75) Inventors: Shigeaki Tanaka, Odawara (JP); Yoshikatsu Kasahara, Ninomiya (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/659,520

(22) Filed: Mar. 11, 2010

(65) Prior Publication Data
US 2010/0172078 A1 Jul. 8, 2010

Related U.S. Application Data

(63) Continuation of application No. 12/068,297, filed on Feb. 5, 2008, now Pat. No. 7,701,710.

(30) Foreign Application Priority Data

Aug. 28, 2007 (JP) ................................ 2007-220647

(51) Int. Cl.
*G06F 1/20* (2006.01)
*H05K 7/20* (2006.01)
*H05K 5/00* (2006.01)

(52) U.S. Cl. ........... 361/679.5; 361/679.48; 361/679.49; 361/690; 361/694; 361/695; 361/716; 361/721; 312/223.2; 312/236; 454/184

(58) Field of Classification Search ........... 361/679.46–679.51, 690, 692, 361/694–695, 715–716, 720–721; 165/80.3, 165/121–122; 312/223.2, 236; 454/184
See application file for complete search history.

(56) References Cited

U.S. PATENT DOCUMENTS

| 5,027,254 | A | * | 6/1991 | Corfits et al. | 361/694 |
| 5,497,288 | A | | 3/1996 | Otis et al. | |
| 5,825,620 | A | * | 10/1998 | Chrysler et al. | 361/695 |
| 5,949,646 | A | | 9/1999 | Lee et al. | |
| 5,963,425 | A | | 10/1999 | Chrysler et al. | |
| 6,594,148 | B1 | * | 7/2003 | Nguyen et al. | 361/695 |
| 6,927,975 | B2 | * | 8/2005 | Crippen et al. | 361/679.49 |
| 6,950,895 | B2 | * | 9/2005 | Bottom | 710/301 |

(Continued)

FOREIGN PATENT DOCUMENTS

JP 2007-156751 12/2005

*Primary Examiner* — Robert J Hoffberg
(74) *Attorney, Agent, or Firm* — Stites & Harbison PLLC; Juan Carlos A. Marquez, Esq.

(57) ABSTRACT

According to the storage control device of the present invention, individual cooling passages are formed for each region in the enclosure and the respective cooling passages are formed bent so as to bypass the connection substrate. As a result, the interior of the enclosure is cooled efficiently. The interior of the enclosure is divided in the front-rear direction by the connection substrate. Logic substrates and battery devices are provided on the front side of the connection substrate and logic substrates and power supply devices are provided on the rear side of the connection substrate. The battery devices and power supply devices located on the left and right sides of the enclosure are each cooled by means of individual cooling passages. The logic substrates are cooled by means of different cooling passages.

18 Claims, 20 Drawing Sheets

U.S. PATENT DOCUMENTS

| | | | |
|---|---|---|---|
| 6,980,435 B2* | 12/2005 | Shum et al. | 361/695 |
| 7,004,233 B2 | 2/2006 | Hasegawa et al. | |
| 7,016,193 B1 | 3/2006 | Jacques et al. | |
| 7,075,788 B2* | 7/2006 | Larson et al. | 361/695 |
| 7,079,387 B2* | 7/2006 | Brooks et al. | 361/679.51 |
| 7,139,170 B2* | 11/2006 | Chikusa et al. | 361/695 |
| 7,262,962 B1 | 8/2007 | McLeod et al. | |
| 7,280,356 B2* | 10/2007 | Pfahnl et al. | 361/695 |
| 7,701,710 B2* | 4/2010 | Tanaka et al. | 361/679.5 |
| 2005/0162830 A1 | 7/2005 | Wortman et al. | |
| 2005/0276017 A1 | 12/2005 | Aziz et al. | |
| 2006/0126292 A1* | 6/2006 | Pfahnl et al. | 361/695 |
| 2007/0127207 A1 | 6/2007 | Katakura et al. | |
| 2007/0211430 A1 | 9/2007 | Bechtolsheim | |
| 2008/0192431 A1 | 8/2008 | Bechtolsheim | |

* cited by examiner

COOLING STRUCTURE FOR RACKMOUNT-TYPE CONTROL DEVICE AND RACK-TYPE STORAGE CONTROL DEVICE

CROSS-REFERENCE TO RELATED APPLICATIONS

This application is a Continuation application of U.S. application Ser. No. 12/068,297 filed Feb. 5, 2008 now U.S. Pat. No. 7,701,710. Priority is claimed based on U.S. application Ser. No. 12/068,297 filed Feb. 5, 2008, which claims the priority to Japanese Application No. 2007-220647 filed on Aug. 28, 2007, the entire disclosure of which is incorporated herein by reference.

BACKGROUND OF THE INVENTION

1. Field of the Invention

The present invention relates to a cooling structure for a rackmount-type control device and a rack-type storage control device.

2. Description of the Related Art

A storage control device comprises a storage section in which a multiplicity of disk drives are connected in the form of an array and provides a host computer ('host' hereinbelow) such as a server with logical storage regions (logical volumes). In order to increase reliability and so forth, the storage control device provides a host with a RAID (Redundant Array of Independent Disks)-based redundant storage region.

A controller, a multiplicity of disk drives and power-related devices, which are housed in the enclosure of the storage control device, each generate heat. Hence, it is necessary to cool the controller, disk drives, and power-related devices respectively. In cases where the interior of the enclosure is air-cooled by means of a large-scale cooling fan device, it is difficult to uniformly air-cool the respective parts of the cooling target (which are the controller, disk drives, and power-related devices). In order to adequately cool the respective parts of the cooling target, a stronger cooling fan must be provided, which results in an increase in fabrication costs and electricity charges, and so forth.

Therefore, a storage control device that is constituted such that the storage control device is divided into a plurality of regions which are, namely, a NAS (Network Attached Storage) header mount region, a logic substrate mount region, and a power-source mount region and such that cooling is performed by providing individual cooling mechanisms in each of the regions has also been proposed (Japanese Application Laid Open No. 2007-156751).

The conventional technology that appears in Japanese Application Laid Open No. 2007-156751 relates to a so-called large-scale storage control device and, therefore, cannot be applied as is to a rack-type storage control device. A large-scale storage control device comprises a cooling passage that allows a cooling air stream to pass from top to bottom at the center of the enclosure. However, a rack-type storage control device does not comprise a central cooling passage of this kind.

In addition, in the case of the conventional technology that appears in Japanese Application Laid Open No. 2007-156751, a cooling hole must be provided in the connection substrate in order to guide the cooling air stream into the central cooling passage. Hence, the surface area that can be used for electrical connections of the total surface area of the connection substrate is reduced and it is therefore difficult to more densely mount a greater number of substrates and devices.

SUMMARY OF THE INVENTION

Therefore, an object of the present invention is to provide a cooling structure of a rackmount-type control device and a rack-type storage control device that makes it possible to improve the cooling efficiency. A further object of the present invention is to provide a cooling structure of a rackmount-type control device and a rack-type storage control device that permit efficient cooling of the interior of an enclosure in which control substrate groups and power-related devices are each densely mounted in front of and behind the connection substrate. Further objects of the present invention will become evident from the description of the embodiments that will follow subsequently.

In order to solve the above problem, the cooling structure for a rackmount-type control device according to an aspect of the present invention comprises an enclosure the front and rear sides of which are each open; a connection substrate that is provided at the center of the enclosure to divide the interior of the enclosure in a front-rear direction; a control substrate group which comprises a plurality of control substrates for executing storage device-related control and which is provided at the front and rear of the enclosure respectively; a power-related device that is provided on both the left and right sides of the respective control substrate groups; a first cooling passage that cools the respective control substrate groups by means of a first cooling air stream; a second cooling passage that cools the respective power-related devices located on one side of the respective control substrate groups among the respective power-related devices by means of a second cooling air stream; and a third cooling passage that cools the respective power-related devices located on the other side of the respective control substrate groups among the respective power-related devices by means of a third cooling air stream, wherein the upstream sides of the first, second, and third cooling passages are provided independent of one another and the downstream sides of the first, second, and third cooling passages are common.

According to the embodiment of the present invention, an inlet of the first cooling passage is provided with an intake fan and an outlet of the first cooling passage is provided with a discharge fan.

According to the embodiment of the present invention, the first lower passage and the second lower passage are provided independently so that air does not pass therebetween.

According to the embodiment of the present invention, the first cooling passage is configured to comprise an inlet section that is provided at the top of the front control substrate group and which is located downstream of the intake fan; a front flow path section that is formed between the respective control substrates constituting the front control substrate group and which is provided in communication with the inlet section; a first lower passage that is formed at the bottom of the enclosure extending from the front to the rear of the enclosure and which is provided in communication with the front flow path section; a rear flow path section that is formed between the respective control substrates constituting the rear control substrate group and which is provided in communication with the first lower passage; and an outlet section that is provided at the top of the rear control substrate group and which is located upstream of the discharge fan in communication with the rear flow path section.

According to the embodiment of the present invention, the second cooling passage and the third cooling passage are configured to comprise a front flow path section that discharges air that flows in via the front of the front power-related device downward and which is provided in the front power-related device that is located at the front of the enclosure among the respective power-related devices; a second lower passage that is formed at the bottom of the enclosure extending from the front to the rear of the enclosure and which is provided in communication with the front flow path section; a rear flow path section which discharges air that flows in via the second lower passage upward, which is provided in a rear power-related device that is located at the rear of the enclosure among the respective power-related devices and which is provided in communication with the second lower passage; and a connection section that is provided at the top of the rear power-related device so that the rear flow path section and the outlet section of the first cooling passage communicate with one another.

According to the embodiment of the present invention, the first lower passage and the second lower passage are provided independently so that air does not pass.

According to the embodiment of the present invention, the rear power-related device comprises a built-in cooling fan.

According to the embodiment of the present invention, the front power-related device is a battery device and the rear power-related device is a power supply device.

According to the embodiment of the present invention, the connection substrate is provided with a substrate support section which is located at both the top and bottom ends of the respective control substrate groups and which serves to support respective control substrates constituting the respective control substrate groups, the substrate support section being provided with cooling holes for allowing air to pass between the respective control substrates.

According to the embodiment of the present invention, a cable passage for connecting cables to the respective control substrates constituting the front control substrate group is provided between the bottom of the first lower passage and the inner surface of the enclosure.

According to the embodiment of the present invention, a plurality of front power-related devices are each provided on both the left and right sides of the front control substrate group, and a plurality of the rear power-related devices are provided on both the left and right sides of the rear control substrate.

According to the embodiment of the present invention, the respective front power-related devices are located on both the left and right sides of the front control substrate group and provided stacked vertically in two steps so that air is able to pass, and the respective rear power-related devices are located on both the left and right sides of the rear control substrate group and provided stacked vertically in two steps so that air is able to pass.

According to the embodiment of the present invention, a first cluster is constituted by the respective control substrate groups and the respective power-related devices which belong to the left half of the enclosure among the respective control substrate groups and the respective power-related devices, and a second cluster is constituted by the respective control substrate groups and the respective power-related devices which belong to the right half of the enclosure among the respective control substrate groups and the respective power-related devices.

According to the embodiment of the present invention, a management device for managing the control device is provided in a horizontal direction at either the top of the enclosure at the front or the top of the enclosure at the rear.

According to the embodiment of the present invention, the respective control substrate groups and the respective power-related devices are configured so as to be capable of being used as is for an enclosure with a different structure from the rack.

A rack-type storage control device according to another aspect of the present invention having a rack, a plurality of storage device housing devices which are detachably provided on the rack, and one control device which controls a plurality of storage devices housed in the respective storage device housing devices and which is detachably provided on the rack, wherein the control device comprises a rackmount-type enclosure that is housed in the rack; a connection substrate that is provided at the center of the enclosure so as to divide the interior of the enclosure in a front-rear direction; a control substrate group which is provided at the front and rear of the enclosure respectively, the control substrate group having a first communication control substrate that handles communications with a device that issues commands requesting data inputs and outputs, a second communication control substrate that handles communications with the respective storage devices, and a memory control substrate that provides each of the first and second communication control substrates with memory regions; a substrate support section which supports the respective control substrate groups from the top and bottom ends thereof, the substrate support section having a plurality of cooling holes that allow air to pass between control substrates constituting the respective control substrate groups; a battery device that is disposed stacked vertically in two steps on both the left and right sides of a front control substrate group that is located at the front of the enclosure among the respective control substrate groups; a power supply device that is disposed stacked vertically in two steps on both the left and right sides of a rear control substrate group that is located at the rear of the enclosure among the respective control substrate groups, the power supply device comprising a built-in cooling fan; an intake fan that is provided at the top of the front control substrate group; a discharge fan that is provided at the top of the rear control substrate group; a first cooling passage which serves to cool the respective control substrate groups, the first cooling passage having an inlet section that is provided at the top of the front control substrate group and which is located downstream of the intake fan; a front flow path section that is formed by the respective cooling holes of the substrate support section and a gap between the respective control substrates constituting the front control substrate group and which is provided in communication with the inlet section; a first lower passage that is formed at the bottom of the enclosure extending from the front to the rear of the enclosure and which is provided in communication with the front flow path section; a rear flow path section that is formed by the respective cooling holes of the substrate support section and a gap between the respective control substrates constituting the rear control substrate group and which is provided in communication with the first lower passage; and an outlet section that is provided at the top of the rear control substrate group and which is located upstream of the discharge fan in communication with the rear flow path section; a second cooling passage which serves to cool the battery devices and the power supply devices located on the left side of the enclosure, the second cooling passage having a front flow path section that discharges air that flows in via the front of the battery device downward; a second lower passage that is formed at the bottom of the enclosure extending from the front to the rear of the enclosure and which is provided in communication with the front flow path section; a rear flow path section that discharges air that flows in via the second lower passage upward and which is provided in the power supply device in communication with the second lower passage; and a connection section that is provided at the top of the power supply device so that the rear flow path section and the outlet section of the first cooling passage communicate with one another; a third cooling passage which serves to cool the battery devices and the power supply devices located on the right side of the enclosure, the third cooling passage having a front flow path section that discharges air that flows in via the front of the battery device downward; a second lower passage that is formed at the bottom of the enclosure extending from the front to the rear of the enclosure and which is provided in communication with the front flow path section; a rear flow path section that discharges air that flows in via the second lower passage upward and which is provided in the power supply device in communication with the second lower passage; and a connection section that is provided at the top of the power supply device so that the rear flow path section and the outlet section of the first cooling passage communicate with one another; and a cable passage for connecting a cable to the respective control substrates constituting the front control substrate group and which is provided between the bottom of the first lower passage and the inner surface of the enclosure.

According to the embodiment of the present invention, the connection substrate is not provided with cooling holes for actively allowing air to pass in a front-rear direction of the enclosure at least within the range in which the respective control substrate groups are connected.

According to the embodiment of the present invention, a management device for collecting information relating to the state of the control device from the respective control substrates and managing this information is placed in a horizontal direction at the top of the enclosure; and a fourth cooling passage for supplying a cooling air stream to the management device is provided at the top of the enclosure independently from the first, second, and third cooling passages.

The cooling structure for a control device according to yet another aspect of the present invention comprises an enclosure the front and rear sides of which are each open; a connection substrate that is provided at the center of the enclosure to divide the interior of the enclosure in a front-rear direction and which substantially does not comprise cooling holes; a control substrate group which comprises a plurality of control substrates for executing storage device-related control and which is provided at the front and rear of the enclosure respectively; a power-related device that is provided on both the left and right sides of the respective control substrate groups; a first cooling passage that cools the respective control substrate groups by means of a first cooling air stream; a second cooling passage that cools the respective power-related devices located on one side of the respective control substrate groups among the respective power-related devices by means of a second cooling air stream; and a third cooling passage that cools the respective power-related devices located on the other side of the respective control substrate groups among the respective power-related devices by means of a third cooling air stream, wherein the first, second, and third cooling passages are formed bent so as to bypass the connection substrate.

DESCRIPTION OF THE SPECIFIC EMBODIMENTS

Figure 1:
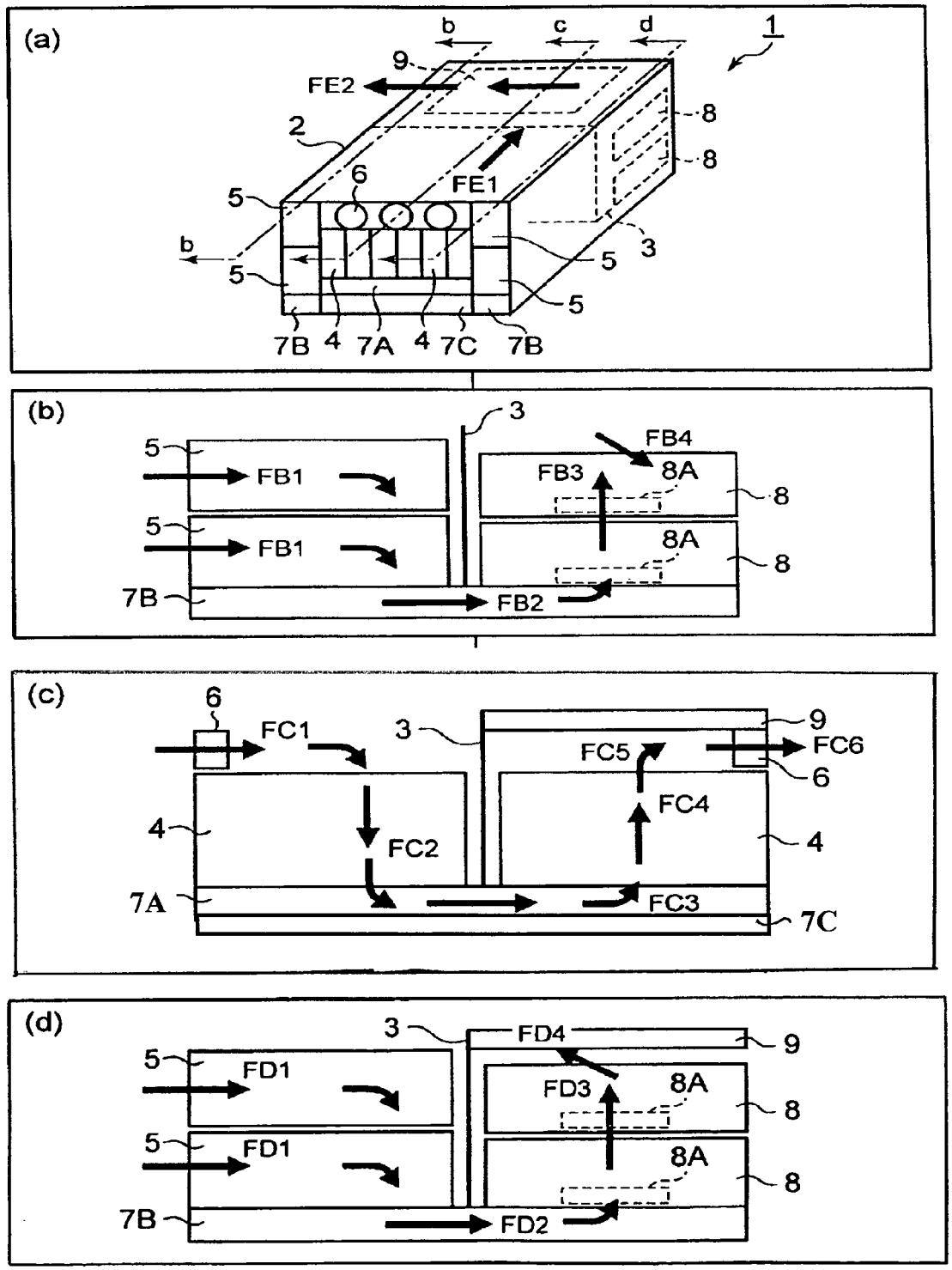
FIG. 1 is an explanatory diagram that provides an overview of an embodiment of the present invention.

An embodiment of the present invention will be described hereinbelow with reference to the drawings. FIG. 1 is an explanatory diagram that provides an overview of an embodiment of the present invention. FIG. 1A shows a controller 1 that is used for the rack-type storage control device. The controller 1 is constituted as a rackmount-type controller 1 and is attached to a rack. The details on the overall constitution of the rack-type storage control device and the controller 1 will be provided in the subsequent embodiment.

The controller 1 comprises an enclosure 2, a connection substrate 3, logic substrates 4 which constitute control substrates, battery devices 5, cooling fans 6, lower passages 7A and 7B, a cable passage 7C, power supply devices 8, and a service processor ('SVP' hereinbelow) 9, for example.

The enclosure 2 is constituted as a rackmount-type enclosure and is formed as a square tube surrounded by four sides. In other words, the front and rear sides of the enclosure 2 are each open. A connection substrate 3 that separates the interior of the enclosure 2 in a front-rear direction is provided at the center of the enclosure 2.

The front and rear sides of the connection substrate 3 have a plurality of logic substrates 4 detachably provided thereon. The plurality of logic substrates 4 that are located at the front of the enclosure 2 can be called the 'front logic substrate group' and the plurality of logic substrates 4 that are located at the rear of the enclosure 2 can be referred to as the 'rear logic substrate group'. The constitution of the front side of the controller 1 is shown in the center of FIG. 1A and the constitution of the rear side of the controller 1 is omitted for the sake of convenience.

Possible logic substrates 4 include, for example, a channel adapter substrate for communicating with the host, a disk adapter substrate for communicating with the disk drives, and a memory substrate that provides each of the channel adapter substrate and disk adapter substrate or the like with a shared memory and a cache memory. The connection substrate 3 is provided with a connector and wiring for electrical connections with each of the logic substrates 4. The respective logic substrates 4 are able to communicate with the other logic substrates 4 and so forth via the connection substrate 3.

The connection substrate 3 is not provided with a cooling hole for the passage of a cooling air stream. As will be mentioned subsequently, the controller 1 comprises a plurality of independent cooling passages that permit the passage of a cooling air stream by bypassing the bottom of the connection substrate 3.

The front of the enclosure 2 has battery devices 5 which are vertically arranged overlapping in two steps and which are located on both the left and right sides of the logic substrates 4. The rear of the enclosure 2 has power supply devices 8 which are vertically arranged overlapping in two steps and which are located on both the left and right sides of the logic substrates 4.

Cooling fans 6 are provided at the top of the logic substrates 4 at the front of the enclosure 2 and the logic substrates 4 at the rear of the enclosure 2. The front cooling fan 6 is constituted as an intake fan that takes in air via the front of the enclosure 2 and blows the air thus taken in into the enclosure 2. The rear cooling fan 6 is constituted as a discharge fan that takes in air from inside the enclosure 2 and blows this air to the rear of the enclosure 2.

A first lower passage 7A is provided at the bottom of the logic substrates 4. A second lower passage 7B that is independent from the first lower passage 7A is provided at the bottom of the battery devices 5 and power-related devices 8 respectively that are located on both the left and right sides of the logic substrates 4.

A cable passage 7C is provided at the bottom of the first lower passage 7A. A connector is provided on the front side of the front logic substrates 4 and one end of the cable is connected to the connector. The other end of the connector is drawn out to the rear of the enclosure 2 via the cable passage 7C.

The SVP 9 is provided horizontally in the enclosure 2 and located on the top of the rear cooling fan 6. The SVP 9 collects information relating to the various states in the controller 1 and is provided in a management device outside FIG. 1.

A plurality of cooling passages which are provided in the controller 1 will be described next. The interior of the controller 1 is divided into a plurality of regions and a dedicated cooling passage is provided for each of these regions.

FIG. 1B schematically shows a state as viewed from the line of arrow b-b in FIG. 1A. FIG. 1B shows the constitution of the second cooling passage that is provided on the left side as viewed from the front (front side) of FIG. 1A.

The second cooling passage is configured to comprise a front flow path section, a second lower passage 7B, a rear flow path section, and a connection section, for example. The front flow path section discharges air that has flowed into the battery devices 5 via the front side of the battery devices 5 to the bottom of the battery devices 5 as indicated by arrow FB1. In other words, a plurality of holes for allowing air to pass are provided in the front and bottom sides of the respective battery devices 5. The respective battery devices 5 are each cooled by the cooling air stream of arrow FB1. As indicated by arrow FB2, the second lower passage 7B allows air that has entered via the battery devices 5 to flow in a horizontal direction and guides the air toward the bottom of the power supply devices 8 which are located toward the rear of the enclosure.

A dedicated cooling fan 8A is provided in each of the power supply devices 8. These fans 8A can also be referred to as the 'internal device fans'. A pressure difference occurs in the second cooling passage as a result of the respective fans 8A and the discharge fan 6 and outside air can be made to enter the battery devices 5 and fed to the power supply devices 8 via the second lower passage 7B.

The outlet section is located upstream of the discharge fan 6 located on the rear side of the enclosure 2 and is provided at the top of the respective rear logic substrates 4. The space between the bottom of the SVP_9 and the upper end of the respective rear logic substrates 4 functions as the outlet section. As indicated by arrow FC 5, the air flows into the outlet section from the gap between the respective rear logic substrates 4. As indicated by arrow FC 6, the air in the outlet section is discharged toward the rear of the enclosure 2 as a result of the discharge fan 6.

FIG. 1C schematically shows a state as viewed from the line of arrow c-c in FIG. 1A. FIG. 1C shows the constitution of the first cooling passage. The first cooling passage is configured to comprise, for example, an inlet section, a front flow path section, a first lower passage 7A, a rear flow path section, and an outlet section.

The inlet section is located downstream of the intake fan 6 that is located at the front side of enclosure 2 and is provided above the respective logic substrates 4. In other words, the space between the upper end of the respective logic substrates 4 and the top of enclosure 2 functions as an inlet section. The air outside the enclosure 2 flows into the inlet section as indicated by arrow FC1 as a result of the intake fan.

The front flow path section is formed between the respective logic substrates 4. In other words, the respective logic substrates 4 have various electronic parts mounted on a substrate and the logic substrates 4 are not covered by a canister or the like. Therefore, a gap that communicates with the inlet section is formed vertically between the respective adjacent logic substrates 4. This gap functions as a front flow path section. The air in the inlet section flows into the front flow path section and drops while cooling the respective logic substrates 4 as indicated by arrow FC2.

The air that flows into the first cooling passage 7A via the gap between the respective logic substrates 4 flows in a horizontal direction toward the rear respective logic substrates 4 before flowing into the gap between the rear logic substrates 4, as indicated by arrow FC3. Similarly to the front flow path section, the gap between the respective rear logic substrates 4 functions as the rear flow path section. As indicated by arrow FC4, the air that has flowed into the gap between the respective rear logic substrates 4 rises while cooling the respective rear logic substrates 4 and flows into the outlet section.

The outlet section is located upstream of the discharge fan 6 located on the rear side of the enclosure 2 and is provided at the top of the respective rear logic substrates 4. The space between the bottom of the SVP9 and the upper end of the respective rear logic substrates 4 functions as the outlet section. As indicated by arrow FC5, the air flows into the outlet section from the gap between the respective rear logic substrates 4. As indicated by arrow FC6, the air in the outlet section is discharged toward the rear of the enclosure 2 as a result of the discharge fan 6.

FIG. 1D schematically shows a state as viewed from the line of arrow d-d in FIG. 1A. FIG. 1D shows the constitution of a third cooling passage that is provided on the right hand side, as viewed from the front (front side) of FIG. 1A. The third cooling passage has a constitution that is substantially the same as that of the second cooling passage.

The third cooling passage is configured to comprise a front flow path section, a second lower passage 7B, a rear flow path section, and a connection section, for example. The air that is taken in via the front side of the battery devices 5 cools the respective battery devices 5 as indicated by the arrows FD1, FD2, and FD3. The air that cools the respective battery devices 5 flows into the connection section and is discharged toward the rear of the enclosure 2 via the discharge fan 6, as indicated by arrow FD4.

As mentioned earlier, in this embodiment, first to third cooling passages for individually cooling the respective regions within the enclosure 2 are provided and the downstream sides of the second and third cooling passages located on both the left and right sides of the first cooling passage are connected to the downstream side of the first cooling passage. Hence, by utilizing each of the fans 6 provided in the first cooling passage, a cooling air stream can be generated in the second and third cooling passages, and the region of the logic substrates 4 and the regions of the battery devices 5 and power supply devices 8 can each be efficiently cooled.

In this embodiment, the first to third cooling passages cause the air that has flowed into the enclosure 2 in a horizontal direction to drop while cooling the cooling target located at the front side of the enclosure 2. Thereafter, the air that has cooled the cooling target at the front side is guided to the rear of the enclosure 2 via the lower passages 7A and 7B which are provided at the bottom of the enclosure 2 and is made to rise while cooling the cooling target located at the rear side of the enclosure 2. Finally, the air, which has reached a high temperature, is discharged in a horizontal direction toward the rear of the enclosure 2 as a result of the discharge fan 6. Thus, the first to third cooling passages of this embodiment have a constitution that is a bent U shape, namely a drop path, a horizontal travel path, and a rising path.

Therefore, in this embodiment, because the cooling air stream is made to pass along the path formed by the U-shaped bend in order to bypass the bottom of the connection substrate 3, the battery devices 5 and power supply devices 8 which are arranged vertically overlapping one another can be efficiently cooled. In addition, the front side of the enclosure 2 and the rear side of the enclosure 2 are made to communicate by means of the lower passages 7A and 7B and, therefore, a cooling hole need not be provided in the connection substrate 3. Hence, the connection substrate 3 can be used as a substrate which is used for electrical connections which is its original role and a greater number of logic substrates 4 and devices 5 and 8 can be densely mounted.

In other words, in a large-scale storage control device of the kind that appears in Japanese Application Laid Open No. 2007-156751, there is room in the housing space and the surface area of the connection substrate can also be made relatively large. Hence, a cooling hole can be provided in the connection substrate. In contrast, in the case of a rack-type storage control device or a rackmount-type controller, the rack size is standardized and, generally speaking, the size of the housing space is smaller than that of a large-scale storage control device. In order to house a multiplicity of logic substrates 4 densely within the space which is more limited than that of a large-scale storage control device, the surface area of the connection substrate 3 must be utilized as effectively as possible. In this embodiment, the cooling hole in the connection substrate 3 is eliminated, and the front and rear inside the enclosure 2 are communicated with one another by means of the lower passages 7A and 7B. Hence, highly dense mounting can be implemented by utilizing the connection substrate 3 effectively. In addition, in this embodiment, a plurality of logic substrates 4 are provided on each of the front and rear sides of the connection substrate 3, whereby mounting of a higher density can be implemented.

In this embodiment, cable passage 7C is provided separately at the bottom of the first lower passage 7A. Hence, the cables that are attached to the respective front logic substrates 4 can be guided to the rear of the enclosure 2 without obstructing the flow of the cooling air stream. In addition, cables can be drawn out toward the rear in bundled form, whereby the workability during a maintenance operation also improves.

In this embodiment, the battery devices 5 are arranged at the front side of the enclosure 2 and the power supply devices 8 are arranged at the rear side of the enclosure 2. By positioning the power supply devices 8 that need to be connected via cables to a power distribution unit (PDU) at the rear side of the enclosure 2, cables can be connected to the power supply devices 8 more easily and the constitution of the enclosure 2 can be simplified. If, in cases where the power supply devices 8 are arranged at the front of the enclosure 2, a path for passing the cables connected to the power supply devices 8 is required. Further characteristics that were not mentioned in this embodiment will become clear in the subsequent embodiments. The storage control device of this embodiment will be described in detail.

First Embodiment

Figure 2:
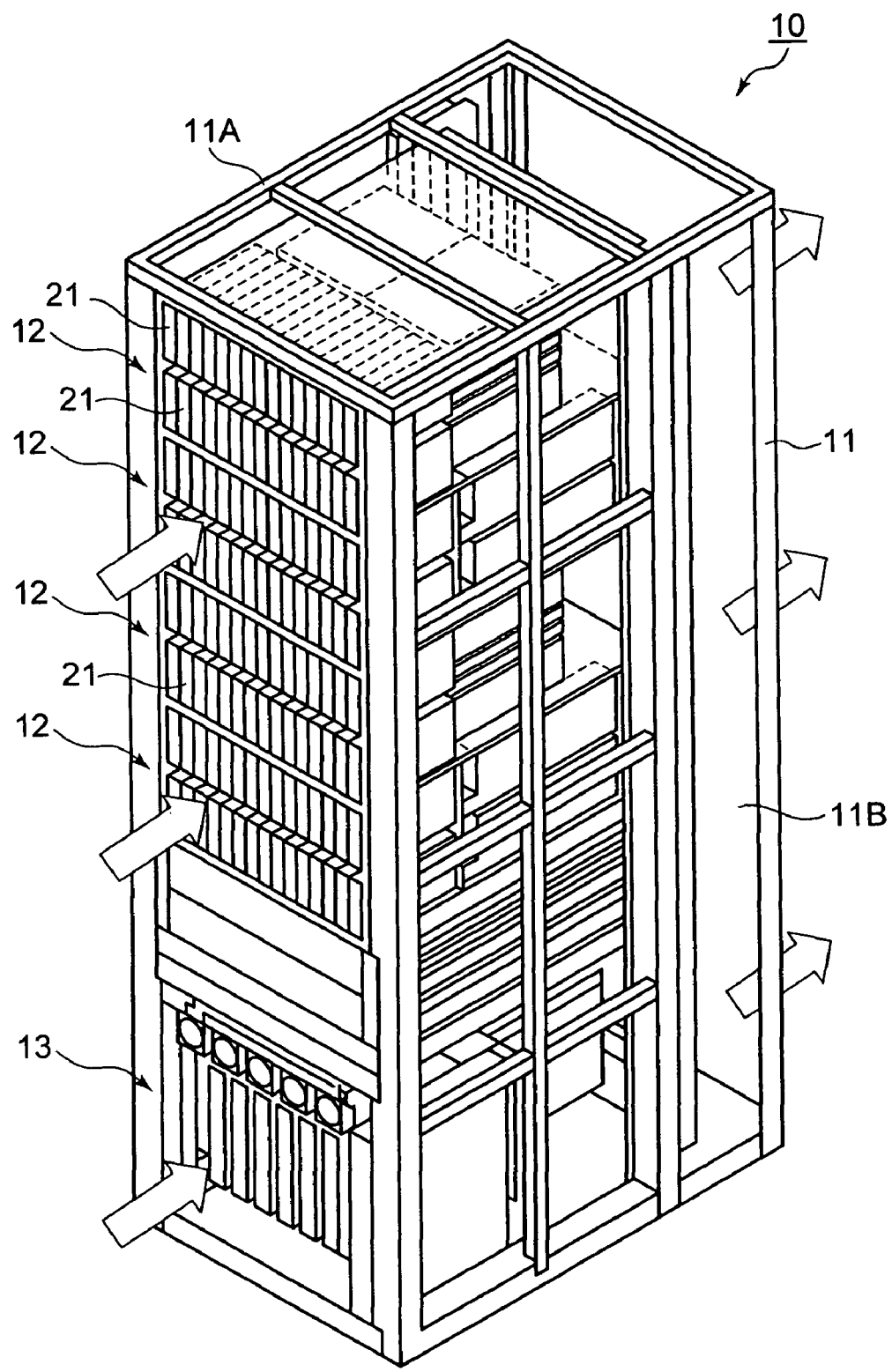
FIG. 2 is a perspective view of a storage control device.

FIG. 2 is a perspective view showing the external constitution of a rack-type storage control device 10. The storage control device 10 comprises a rack 11, a plurality of hard disk boxes 12 which are attached detachably to the rack 11, and one controller 13 that is attached detachably to the bottom of the rack 11, for example.

The controller 13 corresponds to the controller 1 in FIG. 1. As will be described subsequently, the controller 13 is provided with logic substrates 32, battery devices 33, and power supply devices 37 for constituting two clusters, where the right half when the controller 13 is viewed from the front constitutes one cluster and the left half constitutes the other cluster. The respective clusters each comprise a redundant configuration. Therefore, two each of the battery device 33 and power supply devices 37 are prepared for each cluster.

The rack 11 comprises a housing section 11A and a rear space section 11B that is provided at the rear side of the housing section 11A. As indicated by the white arrow in FIG. 2, the cooling air stream flows in via the front side of the rack 11 and flows out from the rear side of the rack 11.

Figure 3:
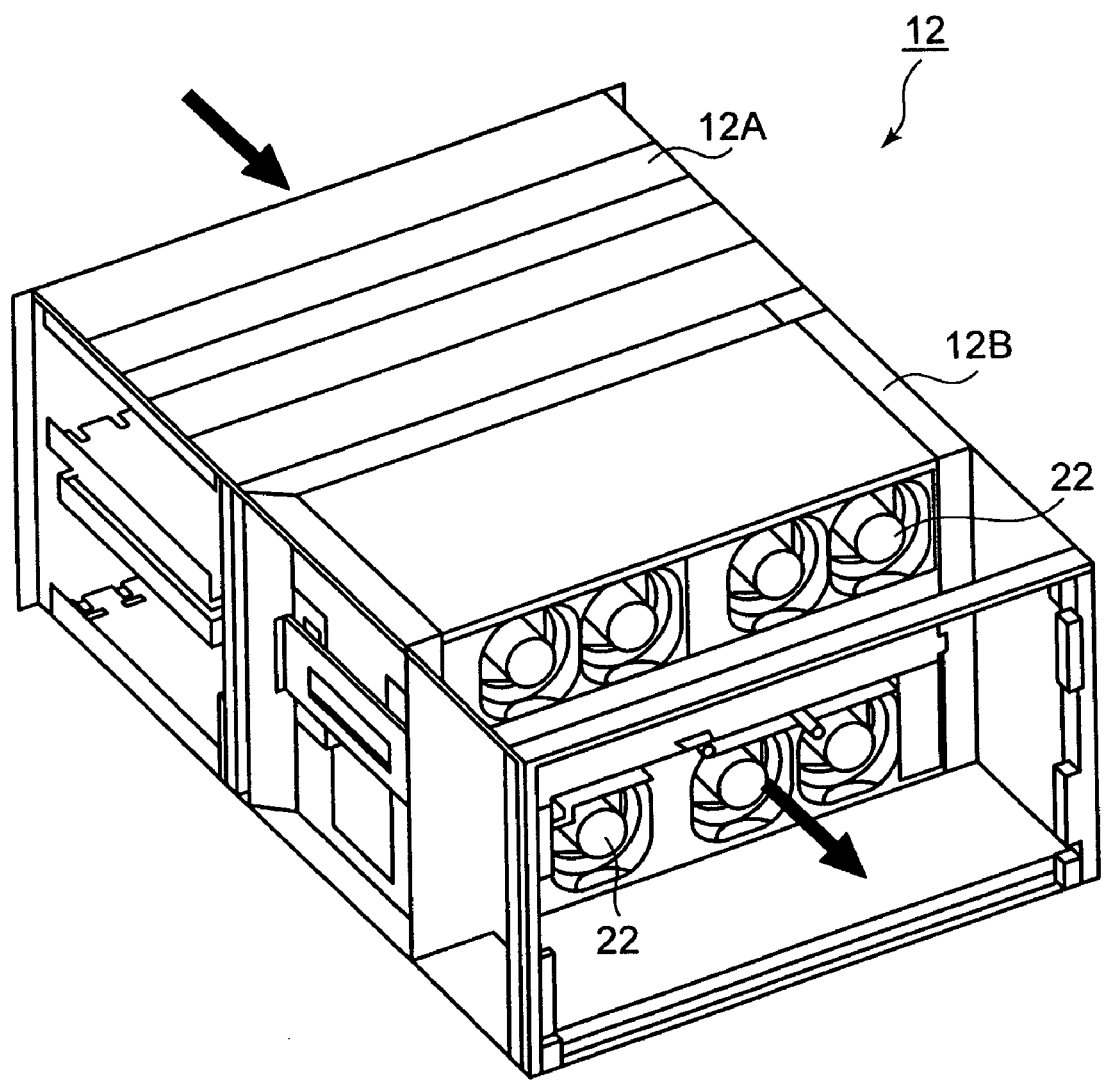
FIG. 3 is a perspective view of a hard disk box.

FIG. 3 is a perspective view in a case where the hard disk box 12 is viewed from the rear. The hard disk box 12 houses a plurality of hard disk drives 21. In the perspective view of FIG. 3, a state where the hard disk drives 21 have been removed is shown. The hard disk box 12 comprises a drive housing section 12A which is located at the front side and a power supply device 12B which is located at the rear side.

The drive housing section 12A houses a plurality of hard disk drives 21. The power supply device 12B is provided with a plurality of cooling fans 22. At least the front side and rear side of all the sides of the respective hard disk drives 21 are provided with a plurality of cooling holes. The air that flows in from the front side of the hard disk drives 21 is discharged to the rear of the hard disk box 12 after cooling the hard disk drives 21 and power supply device 12B.

Although all the hard disk drives are described by way of example as the disk drives 21 in this embodiment, the hard disk drives are not limited to the disk drives 21. A variety of devices that permit the reading and writing of data such as semiconductor memory devices (including flash memory devices), optical disk devices, magneto-optical disk devices, magnetic tape devices, and flexible disk devices can be used.

In addition, in cases where hard disk devices are used as the storage devices, FC (Fibre Channel) disks, SCSI (Small Computer System Interface) disks, SATA disks, ATA (AT Attachment) disks, and SAS (Serial Attached SCSI) disks, and so forth, can be employed, for example.

In cases where semiconductor memory devices are used, a variety of memory devices such as flash memory, FeRAM (Ferroelectric Random Access Memory), MRAM (Magnetoresistive Random Access Memory), ovonic unified memory, RRAM (Resistance RAM) and so forth, for example, can be utilized. The types of storage devices are not limited to the above types. Rather, a variety of other types of storage device which will be produced in the future can also be utilized.

The cable passage 36 is provided at the bottom of the first lower passage 51. One end of the each cable is connected to each of the front logic substrates 32 and the other end of the each cable is drawn out to the rear of the controller 13 via the cable passage 36.

The enclosure 30 is constituted as a rackmount-type enclosure the front and rear sides of which are open. The connection substrate 31 is provided at the center of the enclosure 30. The connection substrate 31 is a substrate that serves to electrically connect the respective logic substrates 32 and the respective devices 33, 37, and 38. The inside of the enclosure 30 is divided in a front-rear direction by the connection substrate 31. Lower passages 50 and 51 are provided, as will be described subsequently, to the bottom of the connection substrate 31. Hence, the left and right ends of the connection substrate 31 are fixed to the enclosure 30, for example.

A plurality of logic substrates 32 are detachably provided on the front and rear sides of the connection substrate 31. An example of the logic substrate 32 will be provided subsequently in conjunction with FIG. 6. The respective logic substrates 32 are attached to the substrate support section 44 shown in FIG. 11 and the substrate support section 43 shown in FIG. 10. The substrate support sections 43 and 44 will be described subsequently.

Battery devices 33 that are stacked vertically in two steps are provided on the left and right ends of the front logic substrate group. The respective battery devices 33 supply predetermined power to the respective logic substrates 32 during power outage, for example. A plurality of cooling holes that allow air to pass therethrough are provided in the front and bottom sides of each battery device 33.

Figure 4:
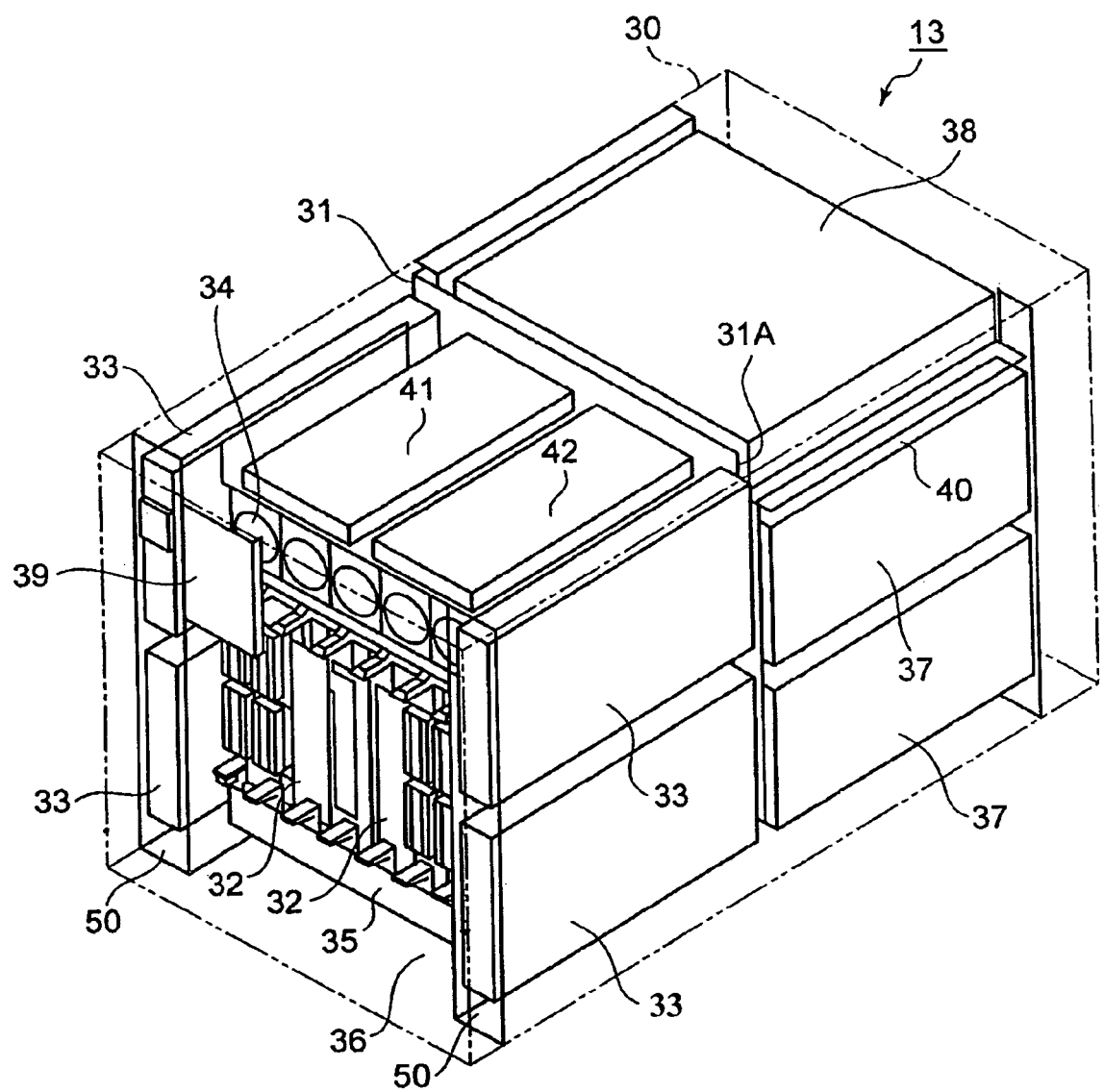
FIG. 4 is a perspective view in which the controller is viewed from the front.
Figure 5:
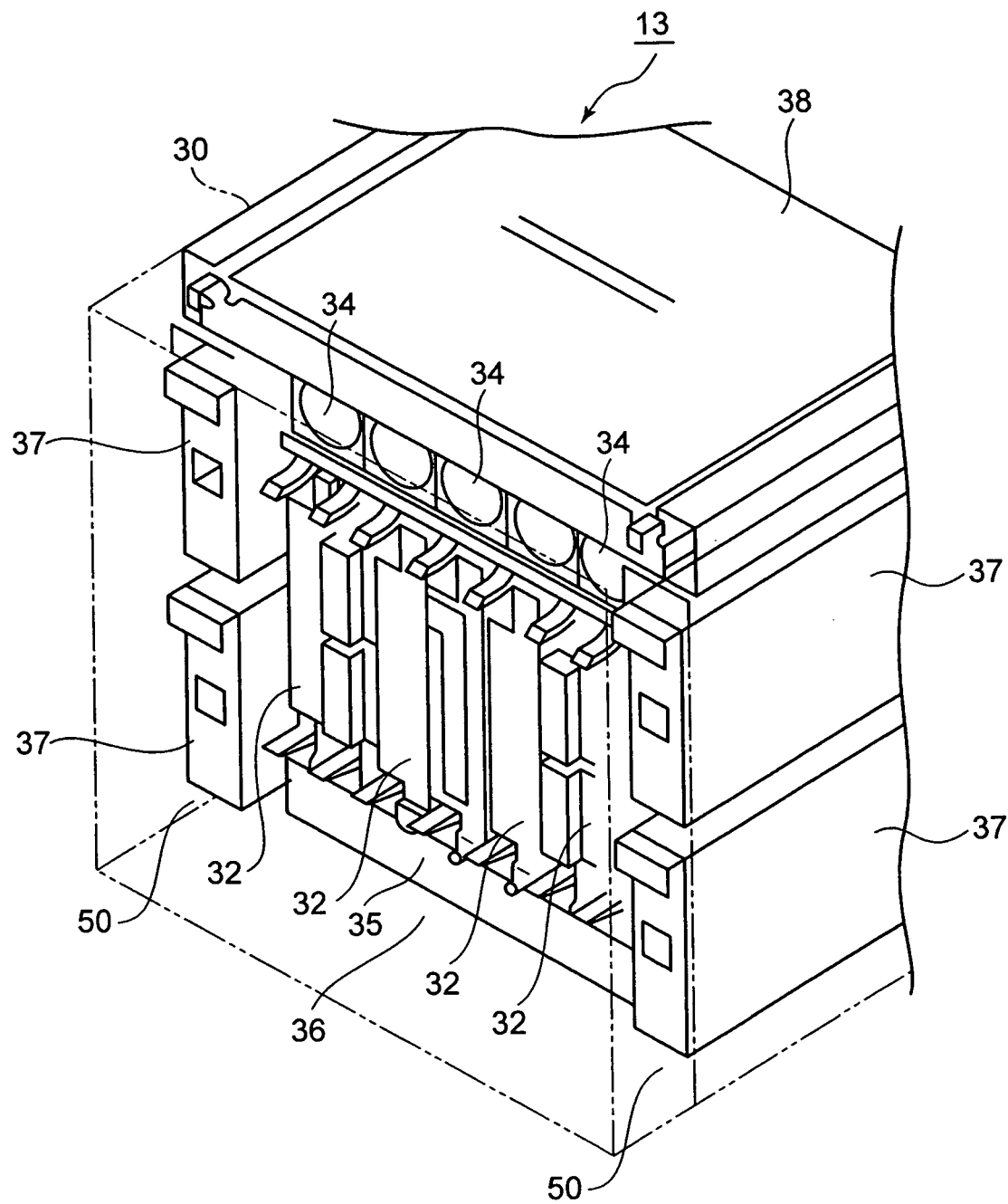
FIG. 5 is a perspective view in which the controller is viewed from the rear in an enlargement.

Cooling fans 34 are provided above the respective logic substrates 32 which are arranged in a front-rear direction. As shown in FIG. 4, an intake fan 34 is provided above the front logic substrate 32. FIG. 5 is a perspective view of the controller 13 from the rear. As shown in FIG. 5, the discharge fan 34 is provided above the rear logic substrate 32. In cases where it is necessary to make a clear distinction between the reference numeral of the intake fan and the reference numeral of the discharge fan, the reference numeral 34F can be assigned to the intake fan and the reference numeral 34R can be assigned to the discharge fan. Likewise, in cases where it is necessary to make a clear distinction between the respective front logic substrates 32 and the respective rear logic substrates 32, the reference numeral 32F can be assigned to the respective front logic substrates 32 and the reference numeral 32R can be assigned to the respective rear logic substrates 32.

Figure 11:
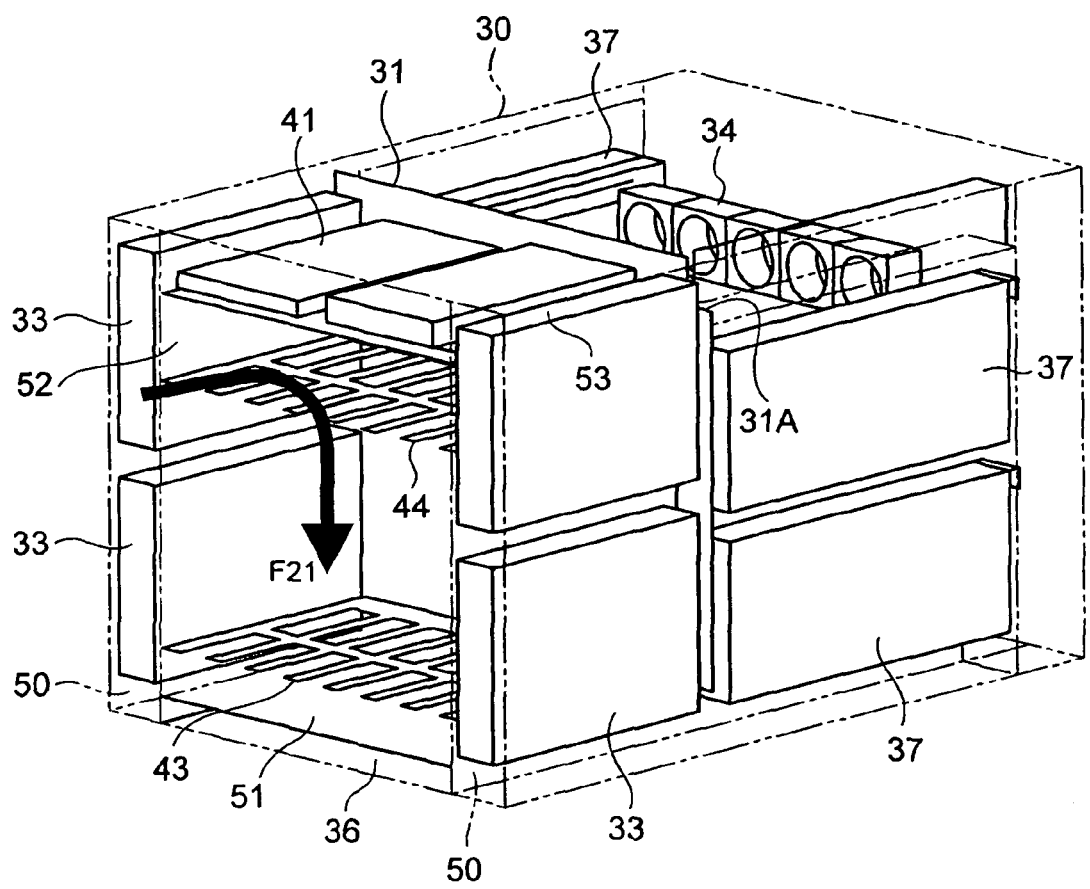
FIG. 11 is a cross-sectional view in the XI-XI direction in FIG. 10.

A first lower passage 51 is provided at the bottom of the front logic substrate 32 as shown in FIG. 11. The front of the first lower passage 51 is covered with a panel 35. Therefore, air flows into the first lower passage 51 via the gap between the respective logic substrates 32. Air moving in a forward direction in the enclosure 30 does not flow directly into the first lower passage 51.

The cable passage 36 is not provided at the bottom of the first lower passage 51. One end of the each cable is connected to each of the front logic substrates 32 and the other end of the each cable is drawn out to the rear of the controller 13 via the cable passage 36.

The power supply devices 37, which are stacked vertically in two steps, are provided on both the left and right sides of the respective front logic substrates 32. The respective power supply devices 37 supply power of a predetermined voltage to the respective logic substrates 32.

The second lower passage 50 is formed extending from the bottom of the respective battery devices 33 to the bottom of the respective power supply devices 37. The second lower passage 50 is separated from the first lower passage 51. A connection section 40 is provided between the top of the power supply device 37 located on the upper level and the bottom of the SVP 38. As a result of the connection section 40, the air that has cooled the respective battery devices 33 and the respective power supply devices 37 is discharged to the rear of the controller 13 by the discharge fan 34 together with air that has cooled the respective logic substrates 32.

The connection substrate 31 has a multiplicity of logic substrates 32 connected to both the front and rear sides thereof and holes for the passage of a cooling air stream are not provided. However, of the two upper ends of the connection substrate 31, a cutout 31A is provided in the end which corresponds with the fan 38A (See FIG. 12) in SVP 38.

The reference numerals 39 shown in FIG. 4 is an operating panel. The user is able to turn on the power to the controller 13 to operate the storage control device 10 and stop the operation of the storage control device 10 by operating the operating panel 39. The reference numerals 41 and 42 in FIG. 4 indicate the devices that are mounted as optional parts. Such optional devices can include, for example, devices for controlling the power supply of the respective hard disk boxes 12. The respective optional devices 41 and 42 are provided above the intake fan 34 and an inlet section 52 (See FIG. 11) that is provided above the respective front logic substrates 32 and the respective optional device 41 and 42 are divided by a plate. That is, air that has been taken in by the intake fan 34 flows into the inlet section 52 but air does not flow in from the option devices 41 and 42.

Figure 6:
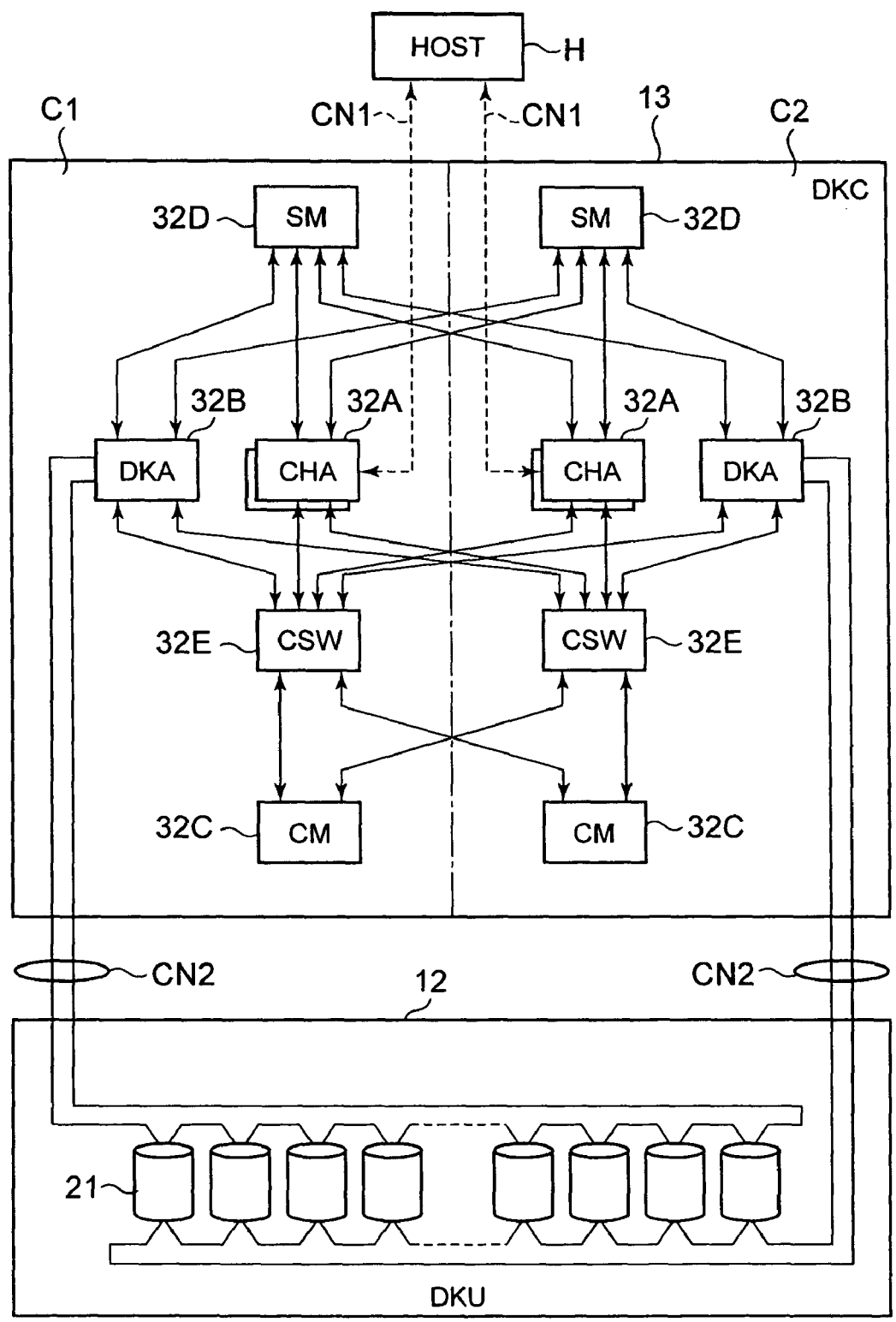
FIG. 6 is a block diagram of the storage control device.

FIG. 6 is a block diagram of the electrical constitution of the controller 13 and hard disk box 12. The controller 13 can be called a DKC (disk controller) because the controller 13 controls the disk drives 21. The hard disk box 12 houses a plurality of disk drives 21 and can therefore also be called a DKU (disk unit).

Examples of the logic substrate 32 can include, for example, a channel adapter ('CHA' hereinbelow) substrate 32A, a disk adapter ('DKA' hereinbelow) substrate 32B, a cache memory ('CM' in FIG. 6) 32C, the shared memory ('SM' in FIG. 6) 32D, and the cache switch ('CSW' in FIG. 6) 32E. Among the above substrates, for example, the cache memory 32C, shared memory 32D, and cache switch 32E can be constituted as one memory control substrate. Furthermore, depending on the case, the CHA substrate 32A and DKA substrate 32B can also be constituted as one control substrate.

A constitution that comprises an NAS substrate that provides an NAS (Network Attached Storage) function is also acceptable.

The CHA substrate 32A is connected to a host H such as a server computer or mainframe computer via a first communication network CN1. The first communication network CN1 can be constituted, for example, as a SAN (Storage Area Network) that utilizes a communication protocol such as FCP (Fibre Channel Protocol) or iSCSI (internet Small Computer System Interface). In cases where the host H is a mainframe computer, for example, a communication protocol such as FICON (Fibre Connection: registered trademark), ESCON (Enterprise System Connection: registered trademark), ACONARC (Advanced Connection Architecture: registered trademark), and FIBARC (Fibre Connection Architecture: registered trademark) or the like can also be employed.

The CHA substrate 32A receives read commands and write commands which are issued by the host H and transmits the processing result to the host H. The CHA substrate 32A corresponds to the 'first communication control substrate'.

The DKA substrate 32B is connected to the respective disk drives 21 in the respective hard disk boxes 12 via the second communication network CN2. The DKA substrate 32B is able to perform data communications with the respective disk drives 21. The second communication network CN2 is constituted as per FOAL (Fibre Channel Arbitrated Loop), for example.

The cache memory 32C temporarily stores data which are received from host H and data which have been read from the disk drives 21. The shared memory 32D stores various management tables and control information which are for use in the management by the storage control device 10. The cache switch 32E controls the data transfer between the respective CHA substrates 32A, the respective DKA substrates 32B, and the cache memory 32C.

The operation of the controller 13 will be described here in simple terms. When a read command is issued by the host H, the CHA substrate 32A receives this read command and stores the fact that a read command has been issued to the shared memory 32D. The DKA substrate 32B references the shared memory 32D as needed and, when an unprocessed read command is discovered, accesses the disk drive 21 where the data requested by the read command are stored, reads the requested data, and stores same in the cache memory 32C. The DKA substrate 32B writes the fact that the data requested by the read command have been stored in the cache memory 32C to the shared memory 32D. The CHA substrate 32A references the shared memory 32D as needed, reads the data stored in the cache memory 32C, and transmits the data to the host H.

In cases where a write command is issued by the host H, the CHA substrate 32A receives the write command and write data and stores the write data in the cache memory 32C. The CHA substrate 32A is able to report the fact that the processing of the write command is complete to the host H at the point where the write data are stored in the cache memory 32C. The DKA substrate 32B writes the data stored in the cache memory 32C to the disk drives 21 while reviewing the timing. A constitution in which the CHA substrate 32A reports the fact that the processing of the write command is complete to the host H after the DKA substrate 32B has written the write data to the disk drives 21 is also possible.

The controller 13 is provided with two clusters C1 and C2. The respective clusters C1 and C2 mutually backup their partner and, even in cases where a fault occurs in either one cluster, the processing can be continued by the other cluster.

Figure 7:
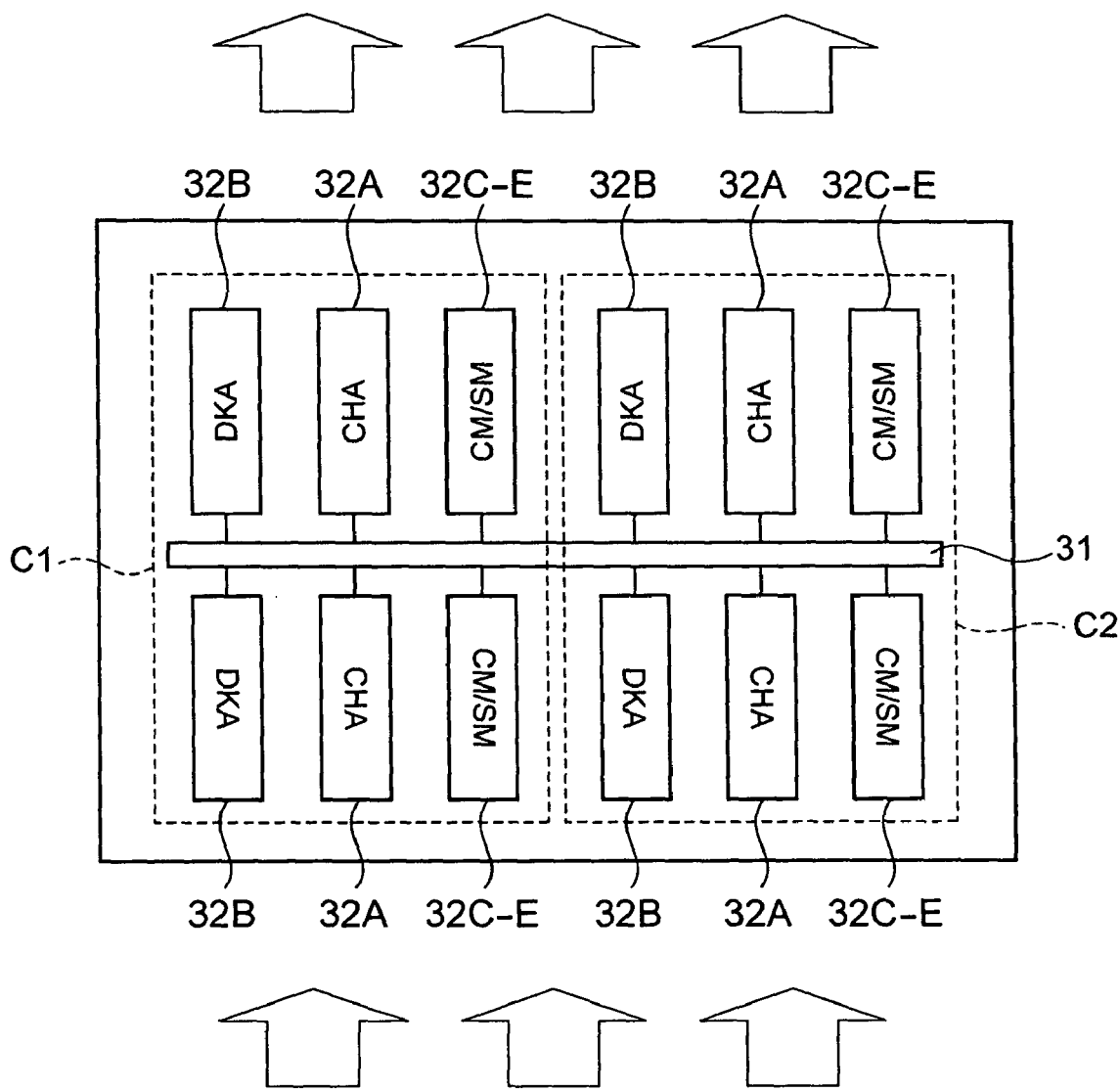
FIG. 7 is an explanatory diagram of a cluster configuration.

FIG. 7 is an explanatory diagram showing the cluster constitution from another perspective. As mentioned earlier, logic substrate groups 32 of the same constitution are provided on both the front and rear sides of the connection substrate 31. When the controller 13 is viewed from the front, the clusters are each constituted with a right half and a left half. The arrows in FIG. 7 indicate the inlet and outlet directions of the cooling air stream. However, as will be described subsequently, the cooling air stream passes via a U-shaped bend within the controller 13.

Figure 8:
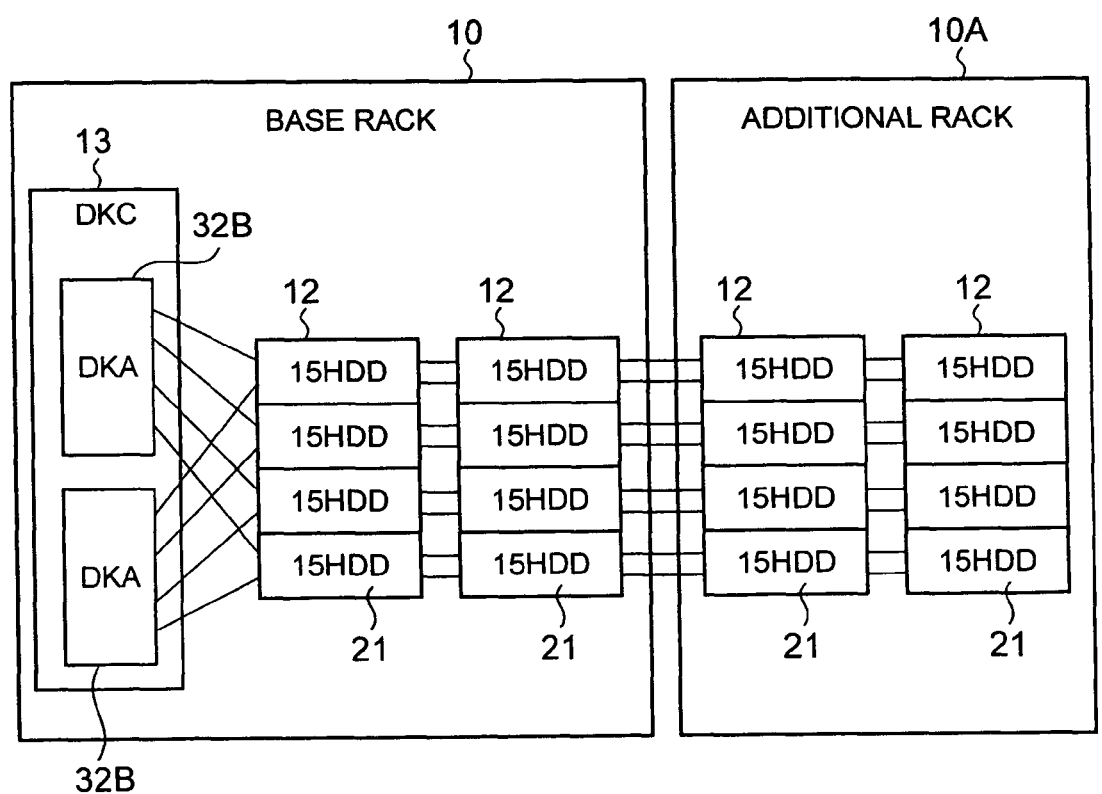
FIG. 8 is an explanatory diagram showing the constitution of connections between disk drives.

FIG. 8 is an explanatory diagram that schematically shows the connected relationship between the controller 13 and hard disk boxes 12. An additional rack 10A can be connected to the storage control device 10. The additional rack 10A contains hard disk boxes 12 and the controller 13 is not installed. By connecting the respective hard disk boxes 12, a greater number of disk drives 21 can be connected to the controller 13.

Figure 9:
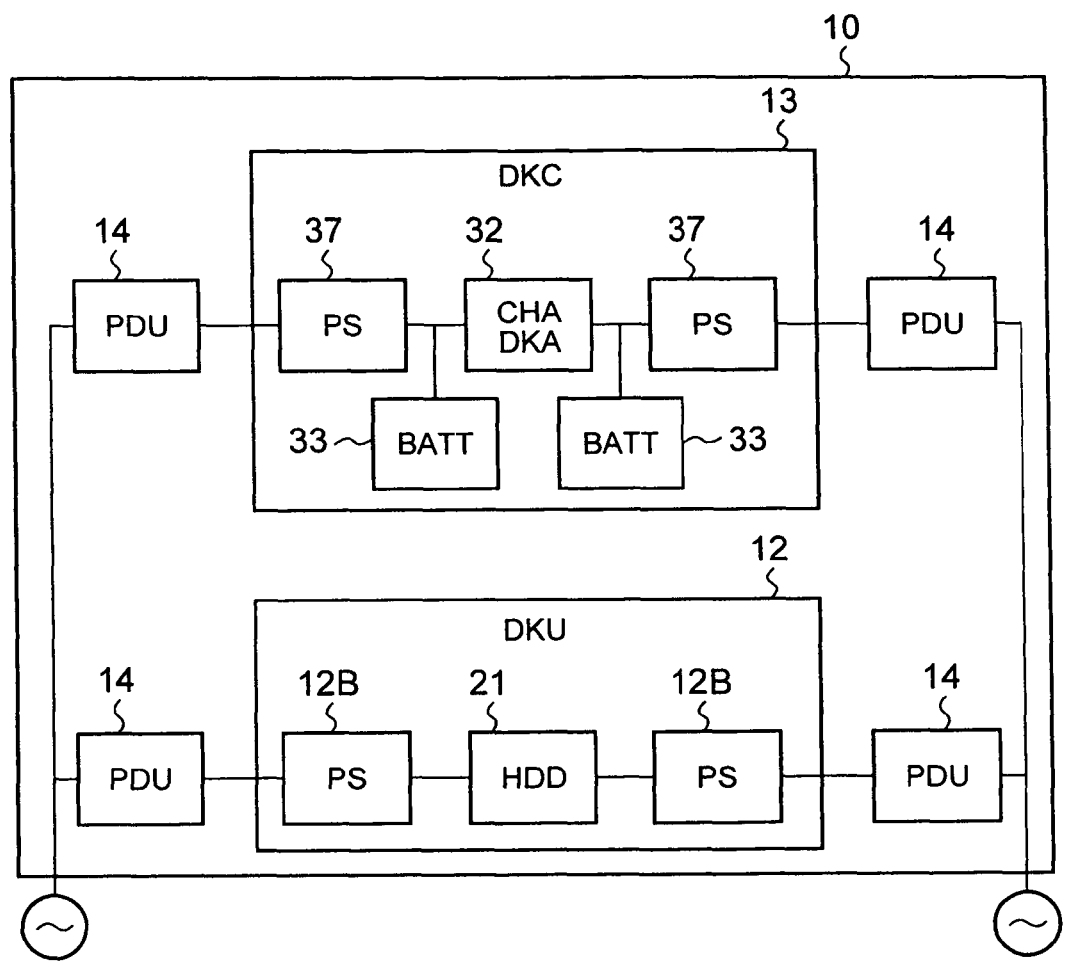
FIG. 9 is an explanatory diagram that shows a power supply constitution.

FIG. 9 is an explanatory diagram that schematically shows the power supply constitution of the storage control device 10. A plurality of PDU 14 are provided in the storage control device 10. Each PDU 14 supplies an external supply to the respective power supply devices 37 in the controller 13 and the respective power supply devices 12B in the hard disk box 12. The power supply systems are also made redundant as shown in FIG. 9 and, in cases where a fault occurs in either one power supply system, power can be supplied to the logic substrate 32 and disk drive 21 respectively from the other power supply system.

Figure 10:
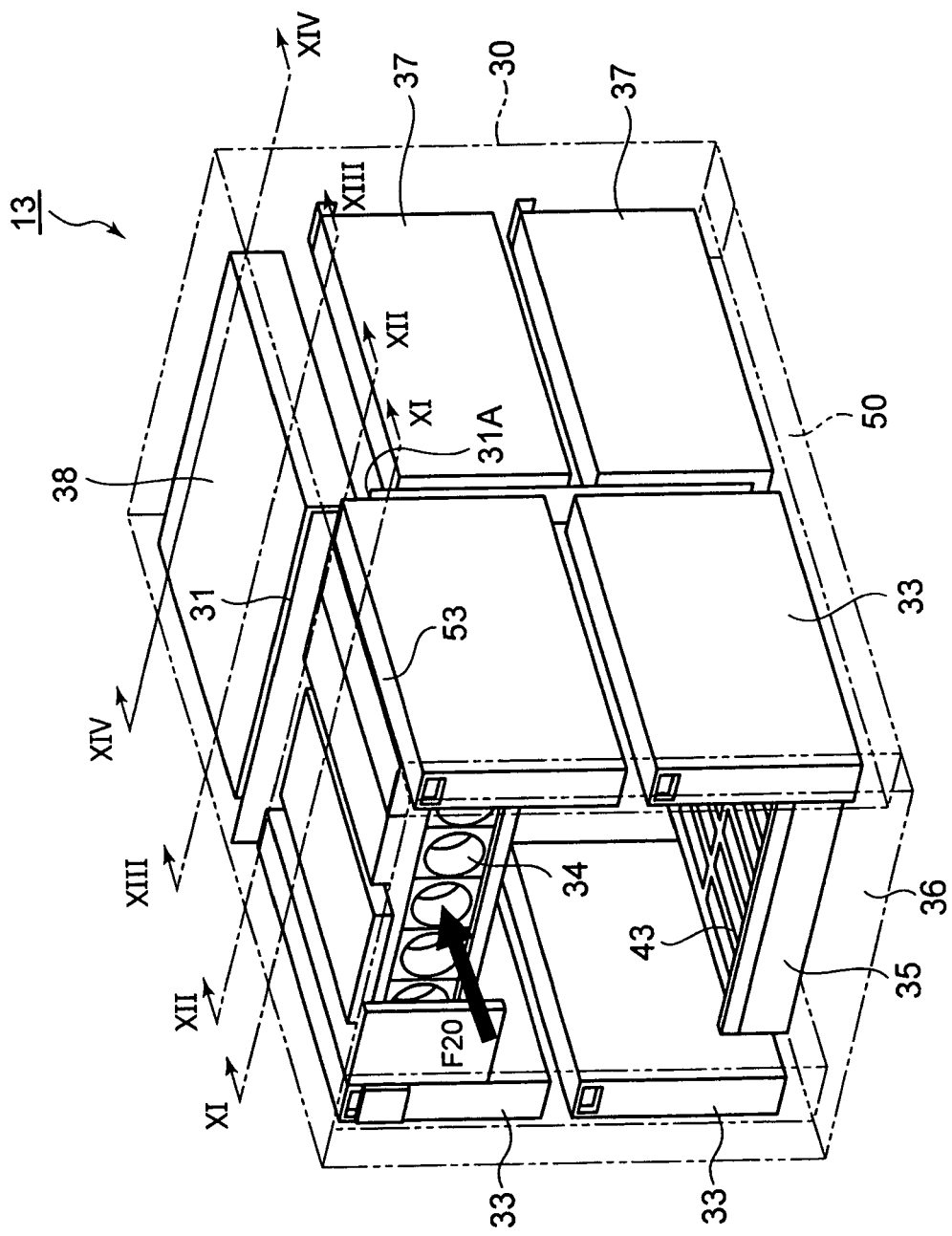
FIG. 10 is a perspective view of a controller that serves to illustrate a lateral cross-section of the controller.

The mechanical structure of the controller 13 will now be described with reference to FIGS. 10 to 14. FIG. 10 is a perspective view in which the controller 13 is viewed from the front in a state where the logic substrate 32 has been removed. Substrate support sections 43 and 44 are attached vertically separate from one another to both the front and rear sides of the connection substrate 31.

FIG. 10 shows the lower substrate support section 43. The substrate support section 43 is constituted by a material such as plate metal and has a fish bone shape overall. That is, the substrate support section 43 comprises a plurality of rail portions for attaching the logic substrates 32 and rectangular cooling holes which are formed between the respective rails. The upper substrate support section 44 is also constituted in the same way as the lower substrate support section 43. Hence, the respective logic substrates 32 are supported vertically by the two substrate support sections 43 and 44. A panel 35 is provided at the front of the lower substrate support section 43 and prevents the first lower passage 51 from being open at the front of the enclosure 30.

A flow path 53 is formed between the top of the upper battery device 33 and the top of the enclosure 30. This flow path 53 is provided at the top of the inlet section 52 separately from the inlet section 52 and supplies air that flows in from the front of the enclosure 30 to the SVP 38.

FIG. 11 is a cross-sectional view in the XI-XI direction in FIG. 10. As indicated by arrow F21, the air that has flowed into the inlet section 52 via the intake fan 34 flows into the gap between the respective logic substrates 32 via the respective cooling holes formed in the upper substrate support section 44 and drops while cooling the respective logic substrates 32. The air flows into the first lower passage 50 via the respective cooling holes formed in the lower substrate support section 43 and passes toward the rear logic substrate group.

Thus, through the provision of the substrate support sections 43 and 44 which have cooling holes formed in accordance with the gaps between the logic substrates 32 above and below the logic substrates 32, the flow of the cooling air stream that cools the logic substrates 32 can be made uniform.

As a result, the cooling air stream that flows within the first cooling passage that is bent in a U shape can be controlled to a certain extent.

Figure 12:
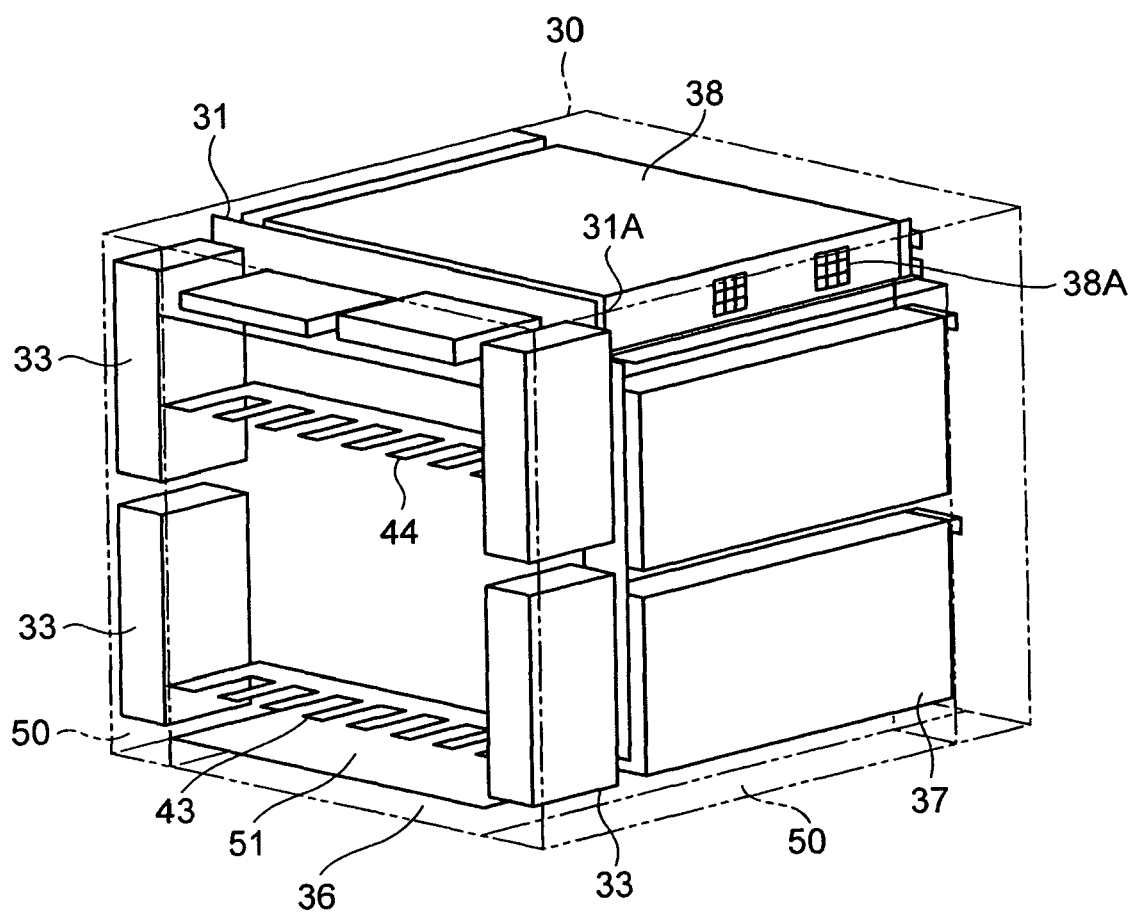
FIG. 12 is a cross-sectional view in the XII-XII direction in FIG. 10.

FIG. 12 is a cross-sectional view in the XII-XII direction in FIG. 10. FIG. 12 illustrates SVP 38. A plurality of intake fans 38A are installed on the side of the SVP 30. These fans 38A are supplied with air via the flow path 53 shown in FIG. 11 and the interior of the SVP 38 is cooled with this air.

Figure 13:
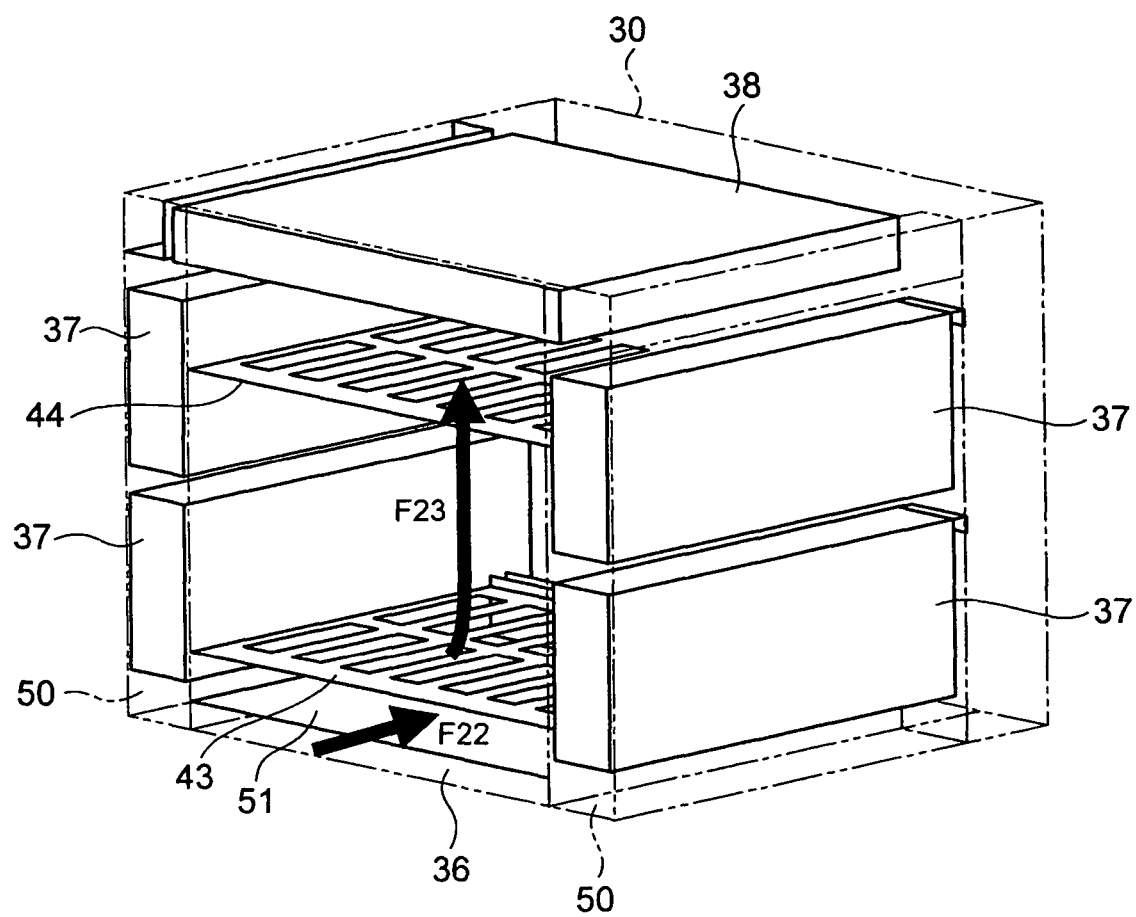
FIG. 13 is a cross-sectional view in the XIII-XIII direction in FIG. 10.

FIG. 13 is a cross-sectional view in the XIII-XIII direction in FIG. 10. As indicated by arrows F22 and F23, at the rear of the enclosure 30, the cooling air stream flows from the first lower passage 51 into the gap between the rear logic substrates 4 via the substrate support section 43.

Figure 14:
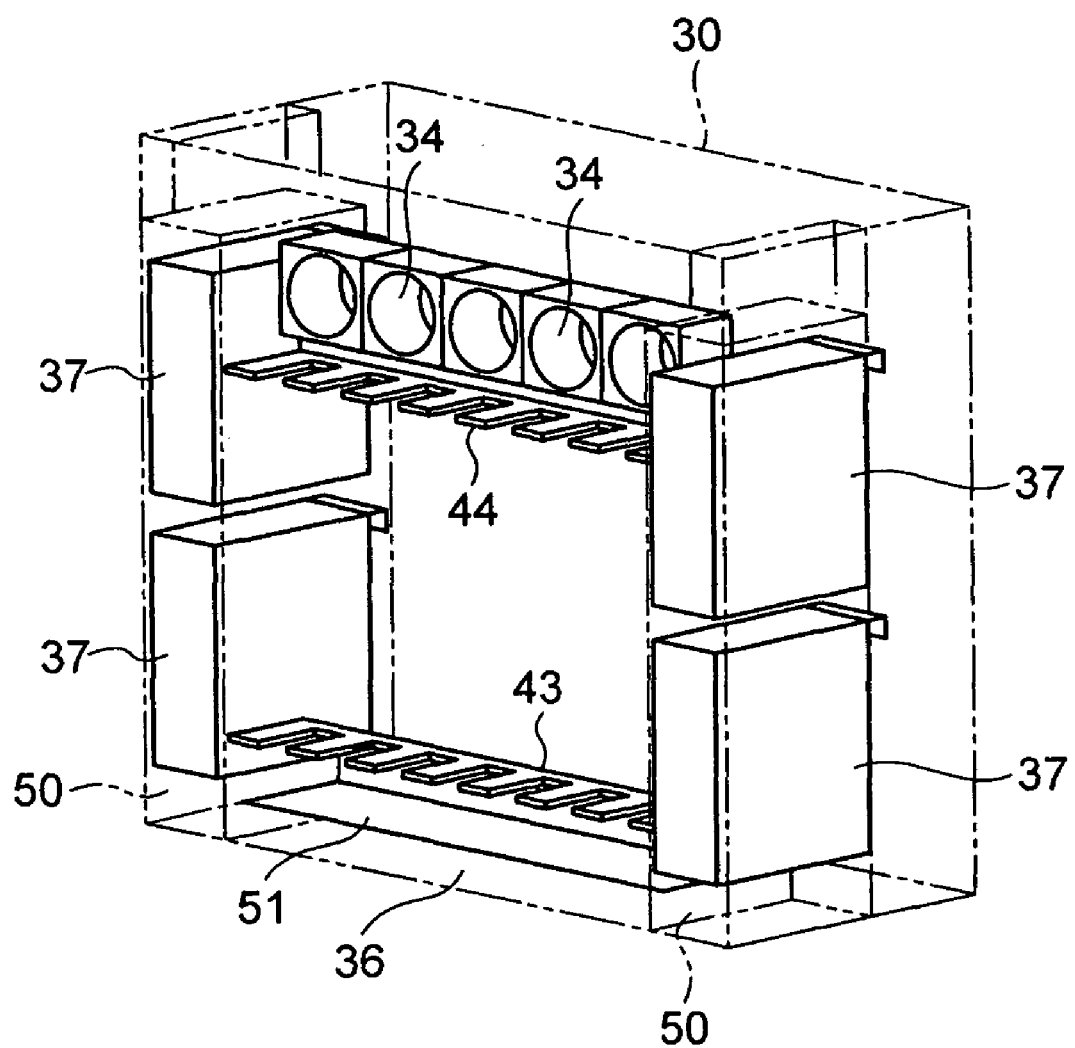
FIG. 14 is a cross-sectional view in the XV-XV direction in FIG. 10.

FIG. 14 is a cross-sectional view in the XV-XV direction in FIG. 10. As was described earlier, although the rear of the enclosure 30 is a little different, the rear of the enclosure 30 basically has the same constitution as the front of the enclosure 30. The main differences reside in the fact that the battery devices 33 are provided at the front of the enclosure 30 but the power supply devices 37 are provided at the rear of the enclosure 30, in that the optional devices 41 and 42 are provided at the top of the enclosure 30 at the front thereof but the SVP 38 is provided at the top of the enclosure 30 at the rear thereof, in that the flow path 53 for supplying air to the SVP 38 is provided at the top of the enclosure 30 at the front thereof, and in that the front fan of the enclosure 30 is constituted as the intake fan 34 but the rear fan of the enclosure 30 is constituted as the discharge fan 34.

Figure 15:
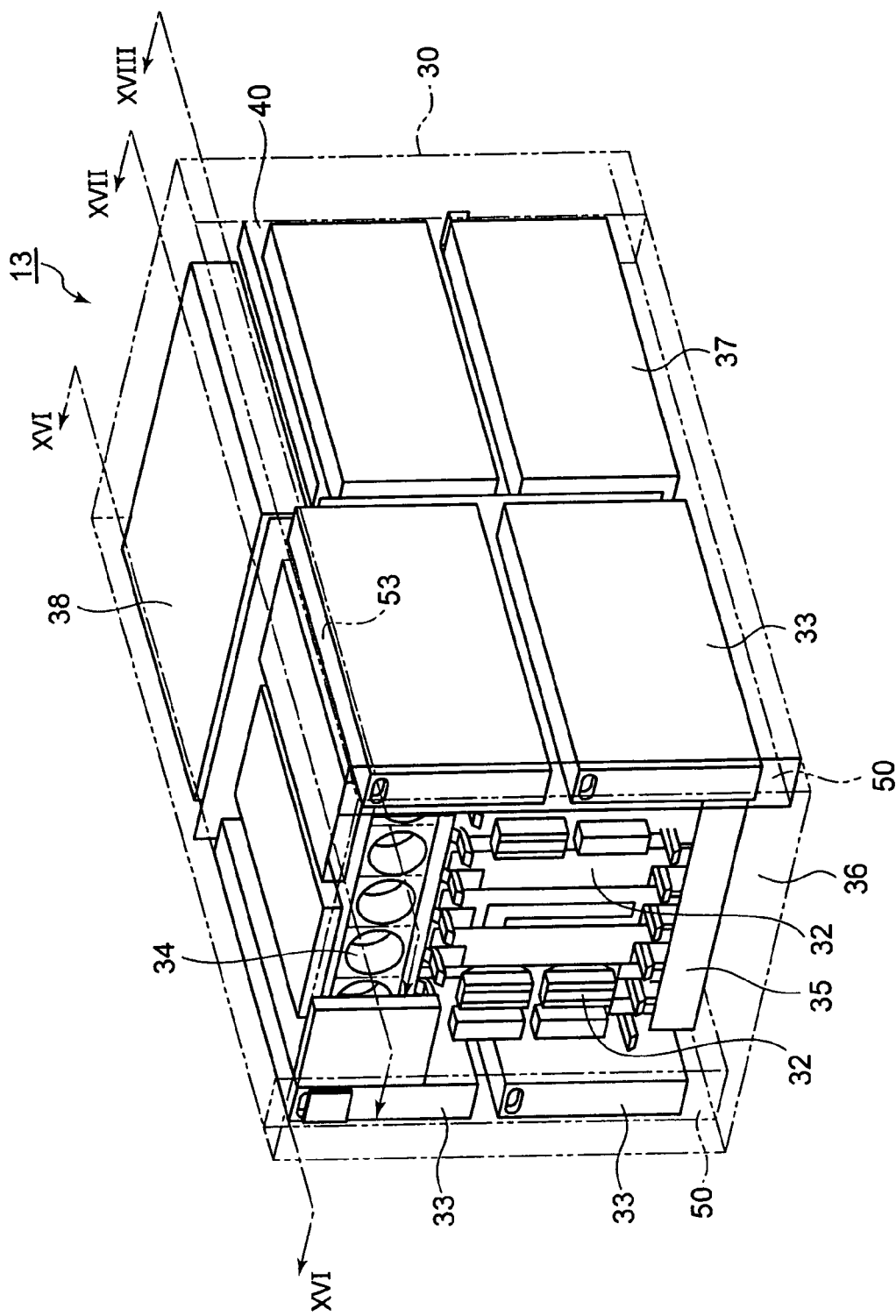
FIG. 15 is a perspective view of the controller that serves to illustrate a vertical cross-section of the controller.
Figure 16:
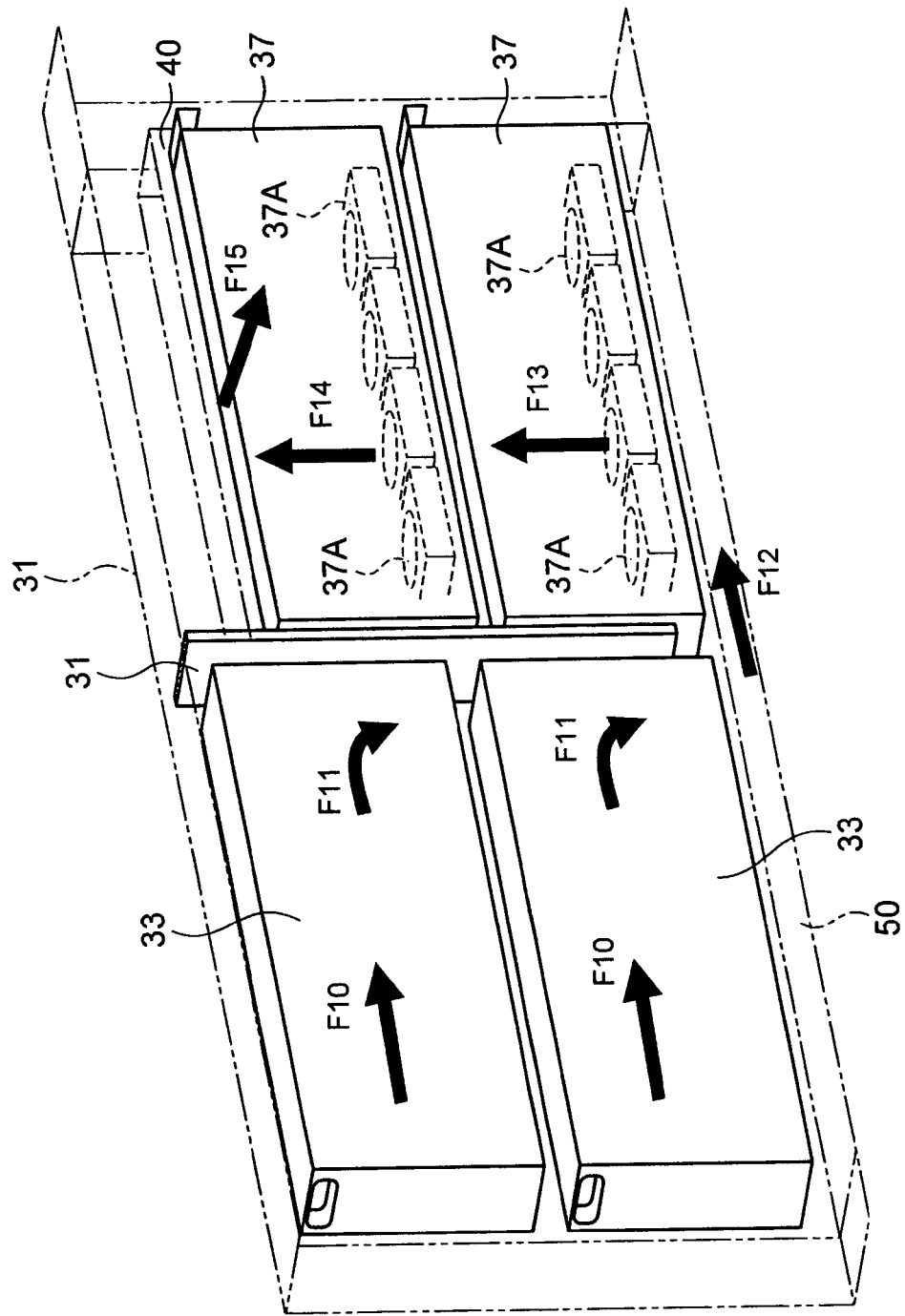
FIG. 16 is a cross-sectional view in the XVI-XVI direction in FIG. 15.

The plurality of cooling passages which are provided in the controller 13 will now be described on the basis of FIGS. 15 to 18. FIG. 15 is a perspective view of the controller 13 from the front thereof. FIG. 16 is a cross-sectional view in the XVI-XVI direction in FIG. 15. FIG. 16 shows the constitution of the second cooling passage.

The second cooling passage comprises, for example, a front flow path section, a second lower passage 50, a rear flow path section, and connection section 40, and the constitution of the second cooling passage is substantially U-shaped. The front flow path section allows the air that has flowed into the battery device 33 via the front side of the battery device 33 as indicated by the arrow F10 to flow to the bottom of the battery device 33 as indicated by the arrow F11. The respective battery devices 33 are cooled by means of the cooling air streams F10 and F11. The second lower passage 50 guides the air that has flowed in from the battery device 33 to the bottom of the power supply device 37 located on the rear side of the enclosure 30, as indicated by arrow F12.

Dedicated cooling fans 37A are each provided in the respective power supply devices 37. As indicated by arrow F13, air flows into the power supply device 37 from the second lower passage 50 as a result of the respective fans 37A and the discharge fan 34.

The air that has flowed into the power supply device 37 from the second lower passage 50 rises while cooling the power supply device 37 as indicated by arrows F13 and F14. The air that has cooled the power supply device 37 flows into the connection section 40 from within the power supply device 37 as indicated by arrow F15. The space between the bottom of the SVP 38 and the top of the power supply device 37 is the connection section 40. The air of the second cooling passage flows downstream of the first cooling passage and is discharged to the outside of the enclosure 30 via the discharge fan 34.

Figure 17:
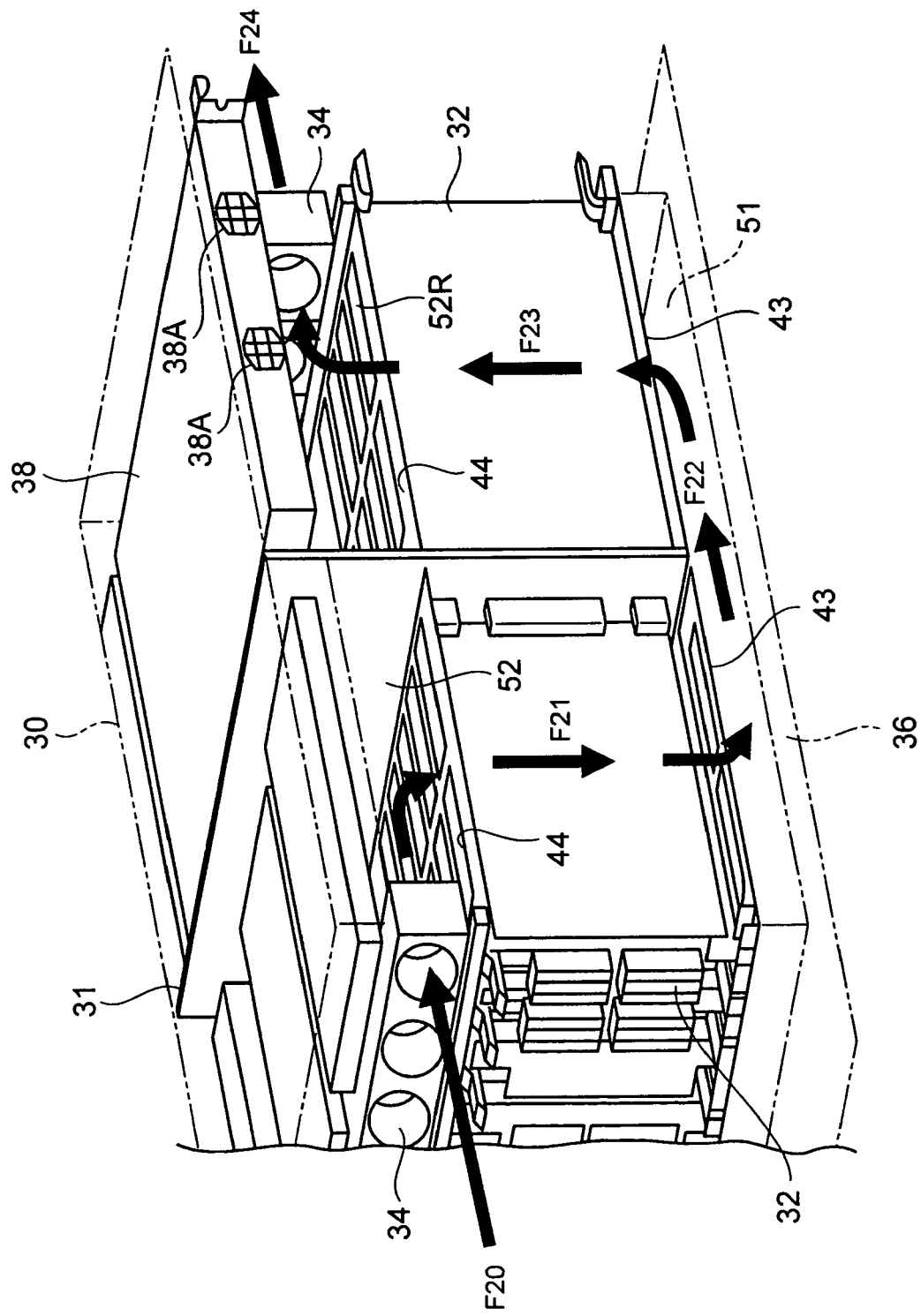
FIG. 17 is a cross-sectional view in the XVII-XVII direction in FIG. 15.

FIG. 17 is a cross-sectional view in the XVII-XVII direction in FIG. 15. FIG. 17 shows the constitution of the first cooling passage. The first cooling passage is configured to comprise, for example, an inlet section 52, a front flow path section, a first lower passage 51, a rear flow path section, and an outlet section 52R.

The inlet section 52 is located downstream of the intake fan 34 and is provided above the respective logic substrates 32. That is, the space between the upper edges of the respective logic substrates 32 and the top of the enclosure 30 is the inlet section 52. As indicated by arrow F20, the air moving in a forward direction in the enclosure 30 flows into the inlet section 52 via the intake fans 34.

The front flow path section is formed between the respective logic substrates 32. As mentioned earlier, the respective logic substrates 32 are attached to the respective rail portions of the substrate support sections 43 and 44 which are vertically arranged and cooling holes are formed between the respective rail portions. Hence, a gap which is determined mechanically is formed between the respective logic substrates 32. This gap constitutes the front flow path. As indicated by arrow F21, the air in the inlet section 52 flows downward while cooling the respective logic substrates 32.

The air that has descended via the gaps between the respective logic substrates 32 flows into the first lower passage 51 and, as indicated by arrow F22, flows toward the bottom of the respective rear logic substrates 32. As indicated by arrow F23, the air in the first cooling passage 51 flows into the respective gaps between the respective rear logic substrates 32 and rises while cooling the respective logic substrates 32.

The air that has cooled the respective rear logic substrates 32 flows into the outlet section 52R and, as indicated by arrow F24, is discharged to the rear of the enclosure 30 by the discharge fan 34.

Figure 18:
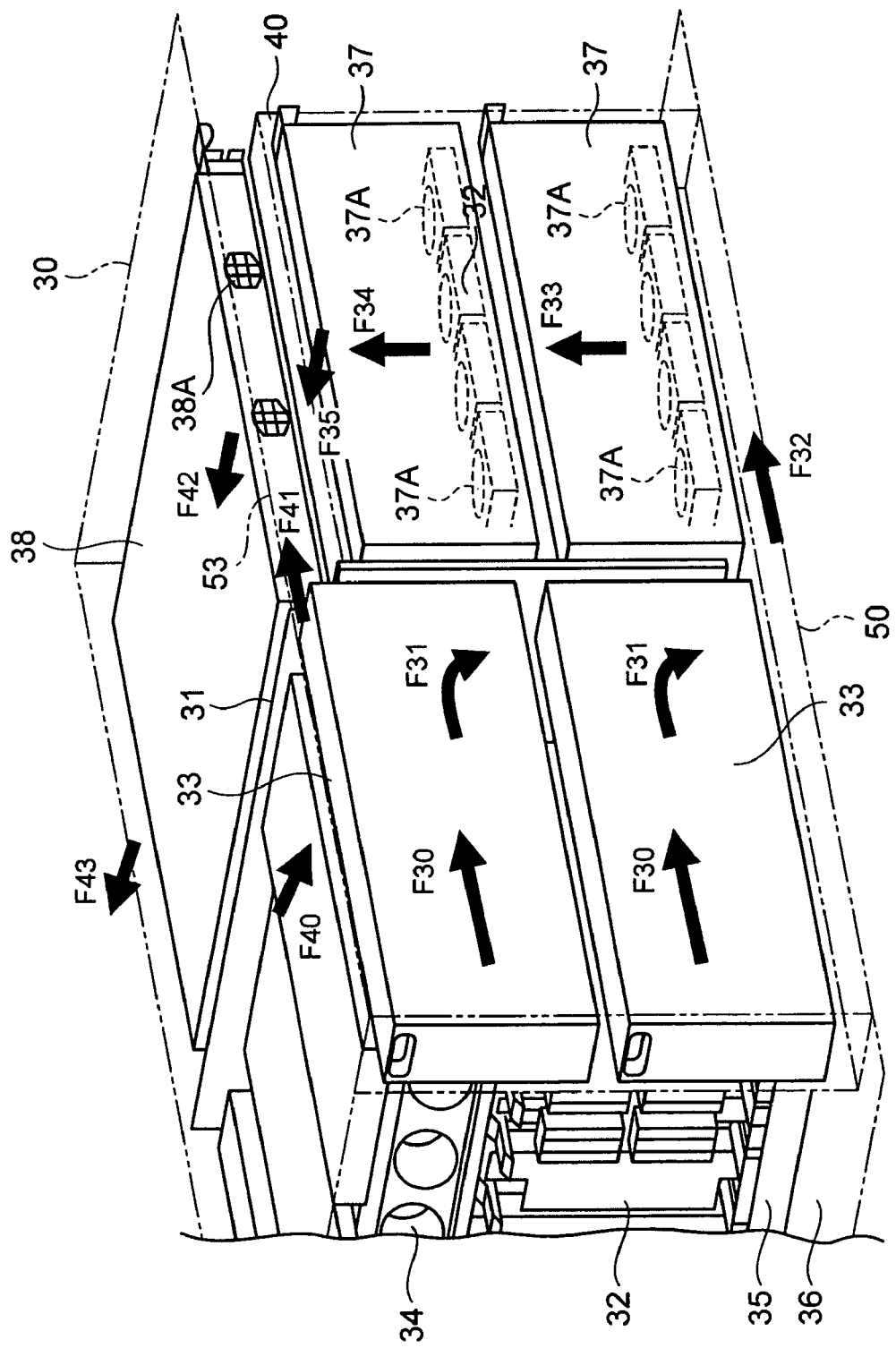
FIG. 18 is a cross-sectional view in the XVIII-XVIII direction in FIG. 15.

FIG. 18 is a cross-sectional view in the XVIII-XVIII direction in FIG. 15. FIG. 18 shows an aspect where the cooling air stream is supplied to the third cooling passage and the SVP. The third cooling passage is constituted in the same way as the second cooling passage that appeared in FIG. 16.

The air (F30) that flows into each battery device 33 drops (F31) while cooling the respective battery devices 33 and flows into the second lower passage 50. This air moves to the bottom of the power supply device 37 via the second lower passage 50 (F32) and is taken into the power supply devices 37 by the fans 37A (F33). The air rises while cooling the respective power supply devices 37 (F34) and flows into the connection section 40 (F35). The air that has flowed into the connection section 40 is discharged to the rear of the enclosure 30 by the discharge fan 34.

The cooling of the SVP 38 will now be described. The SVP 38 of this embodiment is installed horizontally at the top of the enclosure 30 such that the built-in fan 38A is located on the right side of the enclosure 30. As shown in FIG. 15, the flow path 53 is formed between the top of the intake fan 34 and the top of the enclosure 30. The air that has flowed into the enclosure 30 via the flow path 53 (F40) moves to the right side of the SVP 38 via the cutout 31A of the connection substrate 31 (F41) and is taken into the SVP 38 by the built-in fan 38A (F42). The air that has cooled the SVP 38 is discharged to the outside of the enclosure 30 via the cooling hole that is provided on the left side of the SVP 38 (F43).

According to this embodiment as described above, the respective logic substrates 32 which are disposed in an anteroposterior arrangement, the right-hand battery device 33 and power supply device 37, the left-hand battery device 33 and power supply device 37, and the SVP 38 can be cooled by means of individual cooling passages, whereby the cooling efficiency can be improved. For example, the logic substrates 32, which generate a relatively large amount of heat, are cooled using a relatively large amount of air and the battery devices 33 and power supply devices 37, which generate a relatively small amount of heat, can be cooled using a relatively small amount of air.

Here, the point to note is that, in this embodiment, whereas the cooling target that is disposed at the front of the enclosure 30 (logic substrates 32, battery devices 33, power supply devices 37) is cooled by means of air that is flowing from the top to the bottom, the same cooling target that is disposed at the rear of the enclosure 30 is cooled by means of air that is flowing from the bottom to the top. That is, the front cooling target and rear cooling target have cooling air streams that flow in different directions.

According to this embodiment, the cooling target that is located at the front of the enclosure 30 is cooled while the air that has flowed in in a horizontal direction is made to descend, whereupon the air is made to rise toward the rear of the enclosure 30 by the lower passages 50 and 51, cool the cooling target located at the rear of the enclosure 30 and, finally, discharged to the rear of the enclosure 30. In other words, in this embodiment, a cooling passage with a bent shape that is substantially U-shaped or a vertically inverted Ω shape is provided in the enclosure 30. As a result, a cooling hole that serves to allow a cooling air stream to pass in a horizontal direction need not be provided in the connection substrate 31 of this embodiment and the surface area of the connection substrate 31 can be efficiently used for an electrical connection. Hence, in this embodiment, a greater number of logic substrates 32 can be attached to both the front and rear sides of the connection substrate 31 and the logic substrate 32 and the logic substrates 32 and so forth can be provided at a higher density in the narrow space prescribed.

Furthermore, a plurality of battery devices 33 and power supply devices 37 which are vertically stacked can be cooled by means of the bent cooling passage above.

In this embodiment, a cable passage 36 for passing through a cable that is connected to the respective front logic substrates 32 is provided separately from the bottom of the first lower passage 51. Therefore, cables can be drawn out to the rear of the rack 11 without obstructing the flow of the air in the first lower passage 51. As a result, the operability of the maintenance work improves.

In this embodiment, the battery devices 33 are disposed at the front side of the enclosure 30 and the power supply devices 37 are provided at the rear side of the enclosure 30. Because the power supply devices 37 connected to the PDU 14 are disposed at the rear of the enclosure 30, the power supply devices 37 and PDU 14 can be connected more easily using power cables and the constitution can be simplified.

According to this embodiment, pairs are created from left-hand battery devices 33 (as viewed from the front of the enclosure 30) and power supply devices 37 and a cooling passage is provided for each pair. In other words, the flow path for cooling the battery devices 33 and the flow path for cooling the power supply devices 37 are common. As a result, the battery device 33 and power supply device 37 can be cooled using the cooling fan 37A in the power supply device 37. Hence, a cooling fan need not be provided in the battery device 33 and the fabrication costs can be reduced.

Figure 19:
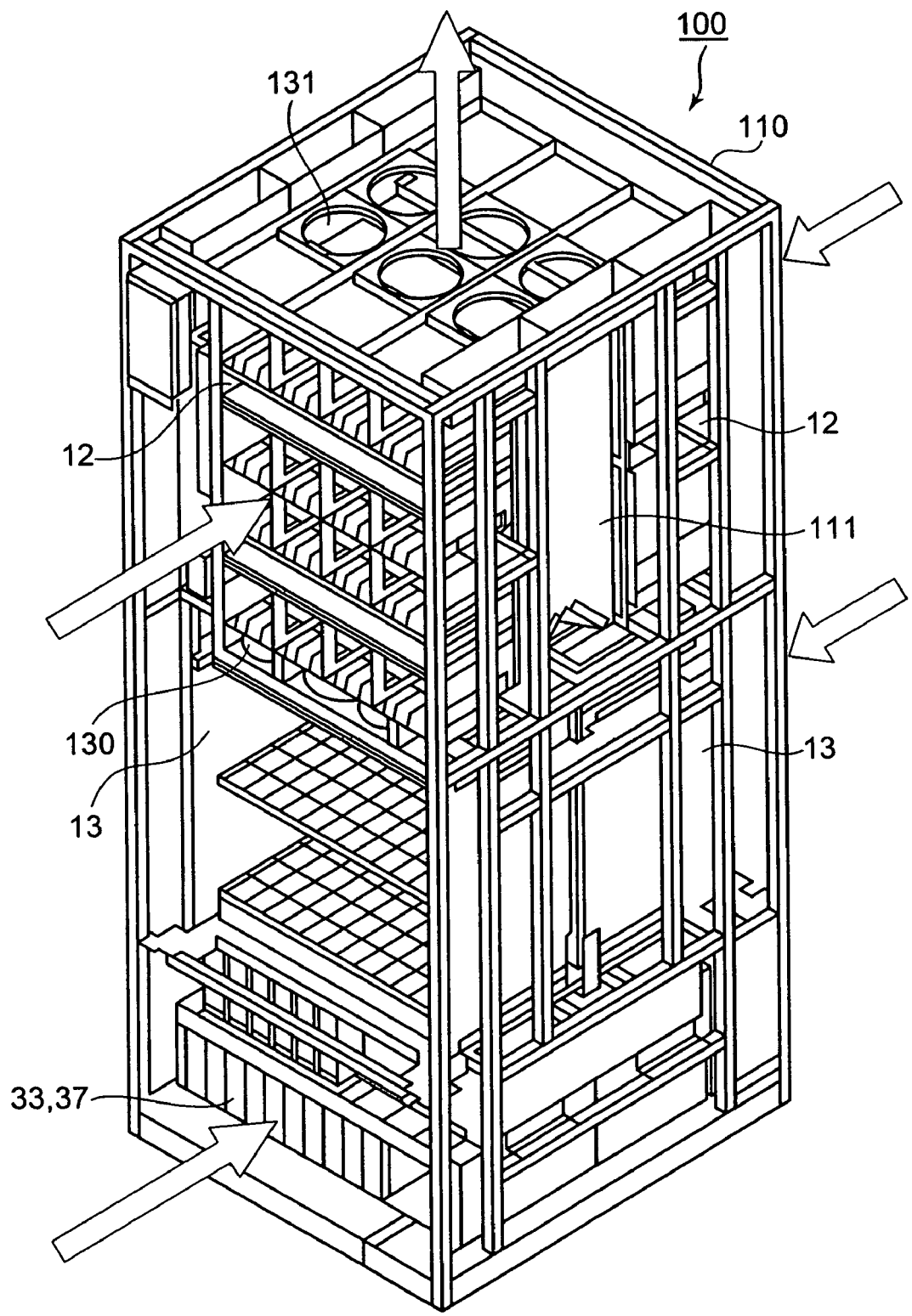
FIG. 19 is a perspective view of a large-scale storage control device.

In addition, in this embodiment, the logic substrates 32, battery devices 33, power supply devices 37, and SVP 38 can be employed as the constituent parts of a large-scale storage control device. FIG. 19 is a perspective view of a large-scale storage control device 100 as a reference example.

Figure 20:
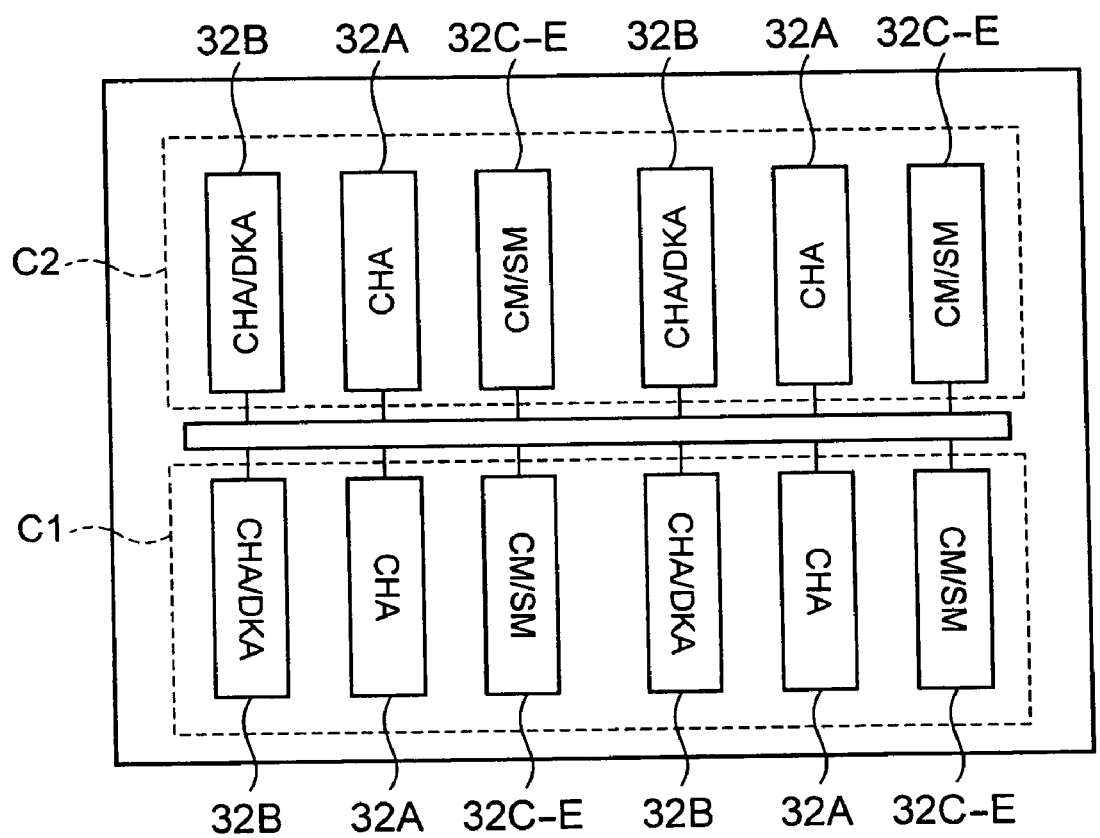
FIG. 20 is an explanatory diagram showing the cluster configuration of a large-scale storage control device.

The large-scale storage control device 100 comprises, for example, a frame main body 110, a center cooling passage 111 that is provided at the center of the frame main body 110, a center cooling fan group 130, and an upper cooling fan group 131. The battery device 33 and power supply device 37 are provided at the bottom of the frame main body 110, the controller 13 is provided at the center of the frame main body 110 and the hard disk box 12 is provided at the top of the frame main body 110. The controller 13 and hard disk boxes 12 and the battery device 33 and power supply device 37 are arranged back to back with the center cooling passage 111 interposed therebetween. That is, the controller 13 and hard disk box 12 and so forth are provided at the front and back with the center cooling passage 111 interposed therebetween. As shown in FIG. 20, one cluster is constituted by a front constituent part while the other cluster is constituted by a rear constituent part.

By changing the installation direction of the logic substrates 32, battery devices 33, power supply devices 37, and SVP 38, same can be used in the large-scale storage control device 100. As a result, in this embodiment, the rack-type storage control device 10 and large-scale storage control device 100 are able to share principal parts and the costs required for development and design as well as the fabrication costs and inventory management costs and so forth can be reduced.

The present invention is not limited to the above embodiments. A person skilled in the art is able to make a variety of additions and modifications and so forth within the scope of the present invention. For example, the SVP can also be provided at the top on the front side of the enclosure.

What is claimed is:

1. A cooling structure for a rackmount-type control device, comprising:
    an enclosure having a front side and a rear side, each of the front side and the rear side being open;
    a connection substrate that is provided at a center of the enclosure to divide an interior of the enclosure in a front-to-rear direction;
    a plurality of control substrates for executing storage device-related control, the plurality of control substrates including front control substrates of a front control substrate group and rear control substrates of a rear control substrate group, the front control substrate group and the rear control substrate group being provided at the front and rear sides of the enclosure respectively;
    a plurality of power-related devices that includes one or more left power-related devices respectively provided on a left side of the front and rear control substrate groups and one or more right power-related devices respectively provided on a right side of the front and rear control substrate groups;
    a first cooling passage that has a first upstream side and a first downstream side and cools the front and rear control substrate groups by means of a first cooling air stream, the first cooling passage being configured to direct the first cooling air stream to pass downward through the front control substrate group at the first upstream side, to redirect the first cooling air stream to pass laterally from the first upstream side to the first downstream side, and to redirect the first cooling air stream to pass upward through the rear control substrate group at the first downstream side;
    a second cooling passage that has a second upstream side and a second downstream side and cools the one or more left power-related devices respectively located on the left side of the front and rear control substrate groups by means of a second cooling air stream, the second cooling passage being configured to direct the second cooling air stream to pass downward through the one or more left power-related devices located on the left side of the front control substrate group at the second upstream side, to redirect the second cooling air stream to pass laterally from the second upstream side to the second downstream side, and to redirect the second cooling air stream to pass upward through the one or more left power-related devices located on the left side of the rear control substrate group at the second downstream side; and a third cooling passage that has a third upstream side and a third downstream side and cools the one or more right power-related devices respectively located on the right side of the front and rear control substrate groups by means of a third cooling air stream, the third cooling passage being configured to direct the third cooling air stream to pass downward through the one or more right power-related devices located on the right side of the front control substrate group at the third upstream side, to redirect the third cooling air stream to pass laterally from the third upstream side to the third downstream side, and to redirect the third cooling air stream to pass upward through the one or more right power-related devices located on the right side of the rear control substrate group at the third downstream side, wherein the first upstream side, the second upstream side and the third upstream side are provided independent of one another and the first downstream side, the second downstream side and the third downstream side are provided in common with one another.

2. The cooling structure for a rackmount-type control device according to claim 1, wherein an inlet of the first cooling passage is provided with an intake fan and an outlet of the first cooling passage is provided with a discharge fan.

3. The cooling structure for a rackmount-type control device according to claim 2, wherein the intake fan is provided at a top of the front control substrate group, and wherein the discharge fan is provided at a top of the rear control substrate group.

4. The cooling structure for a rackmount-type control device according to claim 3, wherein the first cooling passage is configured to comprise:

an inlet section that is provided at the top of the front control substrate group and which is located downstream of the intake fan;

a first front flow path section that is formed between the front control substrates constituting the front control substrate group and which is provided in communication with the inlet section;

a first lower passage that is formed at a bottom of the enclosure extending from the front side to the rear side of the enclosure and which is provided in communication with the first front flow path section;

a first rear flow path section that is formed between the rear control substrates constituting the rear control substrate group and which is provided in communication with the first lower passage; and an outlet section that is provided at the top of the rear control substrate group and which is located upstream of the discharge fan in communication with the first rear flow path section.

5. The cooling structure for a rackmount-type control device according to claim 4, wherein the second cooling passage is configured to comprise:

a second front flow path section that is provided in the one or more right power-related devices provided on the right side of the front control substrate group and discharges air that flows in via a front of the one or more right power-related devices provided on the right side of the front control substrate group downward;

a second lower passage that is formed at the bottom of the enclosure extending from the front side to the rear side of the enclosure and which is provided in communication with the second front flow path section;

a second rear flow path section that is provided in the one or more right power-related devices that are provided on the right side of the rear control substrate group discharges air that flows in via the second lower passage upward, and is provided in communication with the second lower passage; and a first connection section that is provided at a top of the one or more right power-related devices that are provided on the right side of the rear control substrate group so that the second rear flow path section and the outlet section of the first cooling passage communicate with one another, and wherein the third cooling passage is configured to comprise:

a third front flow path section that is provided in the one or more left power-related devices provided on the left side of the front control substrate group and discharges air that flows in via the front of the one or more left power-related devices provided on the left side of the front control substrate group downward;

a third lower passage that is formed at the bottom of the enclosure extending from the front side to the rear side of the enclosure and which is provided in communication with the third front flow path section;

a third rear flow path section that is provided in the one or more left power-related devices that are provided on the left side of the rear control substrate group discharges air that flows in via the third lower passage upward, and is provided in communication with the third lower passage; and a second connection section that is provided at a top of the one or more left power-related devices that are provided on the left side of the rear control substrate group so that the third rear flow path section and the outlet section of the first cooling passage communicate with one another.

6. The cooling structure for a rackmount-type control device according to claim 5, wherein the first lower passage, the second lower passage, and the third lower passage are provided independently so that air does not pass therebetween.

7. The cooling structure for a rackmount-type control device according to claim 5, wherein each of the one or more right power-related devices provided on the right side of the rear control substrate group and each of the one or more left power-related devices provided on the left side of the rear control substrate group comprises a built-in cooling fan.

8. The cooling structure for a rackmount-type control device according to claim 5, wherein a first one of the one or more right power-related devices provided on the right side of the front control substrate group and a first one of the one or more left power-related devices provided on the left side of the front control substrate group is a battery device, and a second one of the one or more right power-related devices provided on the right side of the rear control substrate group and a second one of the one or more left power-related devices provided on the left side of the rear control substrate group is a power supply device.

9. The cooling structure for a rackmount-type control device according to claim 4, wherein the connection substrate is provided with a first substrate support section located at a to end of the front and rear control substrate groups and a second substrate support sections located at a bottom end of the front and rear control substrate groups and which serve to support the respective control substrates constituting the front and rear control substrate groups, the first and second substrate support sections being provided with cooling holes for allowing air to pass between the respective front and rear control substrates.

10. The cooling structure for a rackmount-type control device according to claim 5, wherein the one or more left power-related devices includes two or more left power-related devices that are provided on the left side of the front control substrate group and two or more left power-related devices that are provided on the left side of the rear control substrate group, and wherein the one or more right power-related devices includes two or more right power-related devices that are provided on the right side of the front control substrate group and two or more right power-related devices that are provided on the right side of the rear control substrate group.

11. The cooling structure for a rackmount-type control device according to claim 10, wherein the two or more left power-related devices and the two or more right power-related devices that are respectively located on the left and right sides of the front control substrate group are provided stacked vertically in two steps so that air is able to pass through each power-related device of the two or more left power-related devices and the two or more right power-related devices that are respectively located on the left and right sides of the front control substrate group, and the two or more left power-related devices and the two or more right power-related devices that are respectively located on the left and right sides of the rear control substrate group are provided stacked vertically in two steps so that air is able to pass through each power-related device of the two or more left power-related devices and the two or more right power-related devices that are respectively located on the left and right sides of the rear control substrate group.

12. The cooling structure for a rackmount-type control device according to claim 1, wherein a first cluster is constituted by the front control substrates, the rear control substrates, and the one of more left power-related devices which are located in a left half of the enclosure, and a second cluster is constituted by the front control substrates, the rear control substrates, and the one of more right power-related devices which are located in a right half of the enclosure.

13. The cooling structure for a rackmount-type control device according to claim 1, wherein a management device for managing the rackmount-type control device is provided in a horizontal direction at a top of the enclosure at either the front side or the rear side.

14. The cooling structure for a rackmount-type control device according to claim 1, wherein the plurality of control substrates and the plurality of power-related devices are configured so as to be capable of being used as is for another enclosure with a different structure from the enclosure of the rackmount-type control device.

15. A rack-type storage control device having a rack, a plurality of storage device housing devices which are detachably provided on the rack, and one control unit which controls a plurality of storage devices housed in the respective storage device housing devices and which is detachably provided on the rack, wherein the control device comprises:
 a rackmount-type enclosure that is housed in the rack;
 a connection substrate that is provided at a center of the enclosure so as to divide an interior of the enclosure in a front-to-rear direction;
 a front control substrate group that is provided at a front side of the enclosure and a rear control substrate group that is provided at a rear side of the enclosure, the front and rear control substrate groups comprising a plurality of control substrates including a first communication control substrate that handles communications with a host device that issues commands requesting data inputs and outputs, a second communication control substrate that handles communications with the respective storage devices, and a memory control substrate that provides each of the first and second communication control substrates with memory regions;
 a substrate support section which supports the front and rear control substrate groups from respective top and bottom ends thereof, the substrate support section having a plurality of cooling holes that allow air to pass between the plurality of control substrates respectively constituting the front and rear control substrate groups;
 battery devices that are respectively disposed stacked vertically in two steps on both left and right sides of the front control substrate group;
 power supply devices that are respectively stacked vertically in two steps on both left and right sides of the rear control substrate group, each power supply device of the power supply devices comprising a built-in cooling fan;
 an intake fan that is provided at the top end of the front control substrate group;
 a discharge fan that is provided at the top end of the rear control substrate group;
 a first cooling passage which has a first upstream side and a first downstream side and serves to cool the front and rear control substrate groups by means of a first cooling air stream, the first cooling passage being configured to direct the first cooling air stream to pass downward through the front control substrate group at the first upstream side, to direct the first cooling air stream to pass laterally from the first upstream side to the first downstream side, and to direct the first cooling air stream to pass upward through the rear control substrate group at the first downstream side,
 a second cooling passage that has a second upstream side and a second downstream side and which serves to cool the battery devices and the power supply devices respectively located on the left side of the front and rear control substrate groups by means of a second cooling air stream, the second cooling passage being configured to direct the second cooling air stream to pass downward through the battery devices located on the left side of the front control substrate group at the second upstream side, to redirect the second cooling air stream to pass laterally from the second upstream side to the second downstream side, and to redirect the second cooling air stream to pass upward through the power supply devices located on the left side of the rear control substrate group at the second downstream side;
 a third cooling passage that has a third upstream side and a third downstream side and which serves to cool the battery devices and the power supply devices respectively located on the right side of the front and rear control substrate groups by means of a third cooling air stream, the third cooling passage being configured to direct the third cooling air stream to pass downward through the battery devices located on the right side of the front control substrate group at the third upstream side, to redirect the third cooling air stream to pass laterally from the third upstream side to the third downstream side, and to redirect the third cooling air stream to pass upward through the power supply devices located on the right side of the rear control substrate group at the third downstream side; and
 a cable passage for connecting a cable to the control substrates constituting the front control substrate group,
wherein the first cooling passage has an inlet section that is provided at the top end of the front control substrate group and which is located downstream of the intake fan; a first front flow path section that is provided in communication with the inlet section and formed by the cooling holes of the substrate support section and a gap between the control substrates respectively constituting the front control substrate group; a first lower passage that is formed at a bottom end of the enclosure extending from the front side to the rear side of the enclosure and is provided in communication with the first front flow path section; a first rear flow path section that is provided in communication with the first lower passage and formed by the cooling holes of the substrate support section and a gap between the control substrates respectively constituting the rear control substrate group; and an outlet section that is provided at the top end of the rear control substrate group, the outlet section is located upstream of the discharge fan in communication with the first rear flow path section;

the second cooling passage has a second front flow path section that discharges air that flows in via a front of the battery devices located on the left side of the front control substrate group downward; a second lower passage that is formed at the bottom end of the enclosure extending from the front side to the rear side of the enclosure and provided in communication with the second front flow path section; a second rear flow path section that discharges air that flows in via the second lower passage upward and provided in the power supply devices located on the left side of the rear control substrate group in communication with the second lower passage; and a first connection section that is provided at a top of the power supply devices located on the left side of the rear control substrate group so that the second rear flow path section and the outlet section of the first cooling passage communicate with one another;

the third cooling passage has a third front flow path section that discharges air that flows in via the front of the battery devices located on the right side of the front control substrate group downward; a third lower passage that is formed at the bottom end of the enclosure extending from the front side to the rear side of the enclosure and provided in communication with the second front flow path section; a second rear flow path section that discharges air that flows in via the second lower passage upward and provided in the power supply devices located on the right side of the rear control substrate group in communication with the third lower passage; and a second connection section that is provided at a top of the power supply devices located on the left side of the rear control substrate group so that the third rear flow path section and the outlet section of the first cooling passage communicate with one another; and the cable passage is provided beneath the first lower passage and above a bottom inner surface of the enclosure.

16. The rack-type storage control device according to claim 15, wherein the connection substrate is not provided with cooling apertures for actively allowing air to pass in the front-to-rear direction of the enclosure at least within a range in which the front and rear control substrate groups are connected.

17. The rack-type storage control device according to claim 15, wherein a management device for collecting and managing information relating to a state of the one control unit from the plurality of control substrates of the front and rear control substrate groups is placed in a horizontal direction at a top of the enclosure; and a fourth cooling passage for supplying a fourth cooling air stream to the management device is provided at the top of the enclosure independently from the first, second, and third cooling passages.

18. A cooling structure for a control device, comprising:
an enclosure having a front side and a rear side, each of the front side and the rear side being open;
a connection substrate that is provided at a center of the enclosure to divide an interior of the enclosure in a front-to-rear direction and which substantially does not comprise cooling holes;
a plurality of control substrates for executing storage device-related control, the plurality of control substrates including front control substrates of a front control substrate group and rear control substrates of a rear control substrate group, the front control substrate group and the rear control substrate group being provided at the front and rear sides of the enclosure respectively;
a plurality of power-related devices that includes one or more power-related devices respectively provided on a left side of the front and rear control substrate groups and one or more power-related devices respectively provided on a right side of the front and rear control substrate groups;
a first cooling passage that has a first upstream side and a first downstream side and cools the front and rear control substrate groups by means of a first cooling air stream, the first cooling passage being configured to direct the first cooling air stream to pass downward through the front control substrate group at the first upstream side, to redirect the first cooling air stream to pass laterally from the first upstream side to the first downstream side, and to redirect the first cooling air stream to pass upward through the rear control substrate group at the first downstream side;
a second cooling passage that has a second upstream side and a second downstream side and cools the one or more power-related devices respectively located on the left side of the front and rear control substrate groups by means of a second cooling air stream, the second cooling passage being configured to direct the second cooling air stream to pass downward through the one or more power-related devices respectively located on the left side of the front control substrate group at the second upstream side, to redirect the second cooling air stream to pass laterally from the second upstream side to the second downstream side, and to redirect the second cooling air stream to pass upward through the one or more power-related devices respectively located on the left side of the rear control substrate group at the second downstream side; and
a third cooling passage that has a third upstream side and a third downstream side and cools the one or more power-related devices respectively located on the right side of the front and rear control substrate groups by means of a third cooling air stream, the third cooling passage being configured to direct the third cooling air stream to pass downward through the one or more power-related devices respectively located on the right side of the front control substrate group at the third upstream side, to redirect the third cooling air stream to pass laterally from the third upstream side to the third downstream side, and to redirect the third cooling air stream to pass upward through the one or more power-related devices respectively located on the right side of the rear control substrate group at the third downstream side,
wherein the first cooling passage, the second cooling passage, and the third cooling passage are formed bent so as to bypass the connection substrate.

* * * * *